United States Patent
Yano et al.

(10) Patent No.: US 9,129,875 B2
(45) Date of Patent: Sep. 8, 2015

(54) SOLID-STATE IMAGING DEVICE AND METHOD FOR MANUFACTURING THE SAME

(71) Applicant: Panasonic Corporation, Osaka (JP)

(72) Inventors: Hisashi Yano, Toyama (JP); Shigeru Suzuki, Toyama (JP); Gen Okazaki, Shiga (JP); Akira Oodaira, Aomori (JP); Motonari Katsuno, Toyama (JP); Tetsuya Nakamura, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/244,139

(22) Filed: Apr. 3, 2014

(65) Prior Publication Data

US 2014/0210033 A1 Jul. 31, 2014

Related U.S. Application Data

(63) Continuation of application No. PCT/JP2012/006547, filed on Oct. 12, 2012.

(30) Foreign Application Priority Data

Oct. 13, 2011 (JP) .................................. 2011-225587

(51) Int. Cl.
*H01L 27/146* (2006.01)

(52) U.S. Cl.
CPC .... *H01L 27/14625* (2013.01); *H01L 27/14621* (2013.01); *H01L 27/14623* (2013.01);
(Continued)

(58) Field of Classification Search
CPC ................... H01L 27/14621; H01L 27/14627; H01L 27/14632; H01L 27/14625; H01L 27/14685; H01L 27/14645

USPC ................. 257/222, 257, 292, 294, 432, 435; 438/57, 65, 69

See application file for complete search history.

(56) References Cited

U.S. PATENT DOCUMENTS

| 8,139,131 B2 | 3/2012 | Komatsu et al. |
| 8,300,128 B2 | 10/2012 | Toumiya |

(Continued)

FOREIGN PATENT DOCUMENTS

| JP | 3-282403 | 12/1991 |
| JP | 8-181115 | 7/1996 |

(Continued)

OTHER PUBLICATIONS

International Search Report issued Dec. 4, 2012 in corresponding International Application No. PCT/JP2012/006547.

*Primary Examiner* — Kyoung Lee
*Assistant Examiner* — Ratisha Mehta
(74) *Attorney, Agent, or Firm* — Wenderoth, Lind & Ponack, L.L.P.

(57) ABSTRACT

In a pixel unit of a solid-state imaging device, a semiconductor substrate is provided with a plurality of photodiodes, a first insulating film includes a recess in a portion above each of the photodiodes, a second insulating film embeds the recess, a plurality of color filters is formed on the second insulating film, the color filters each corresponding to one of the photodiodes, a partition is provided between adjacent ones of the color filters, the partition being a part of a third insulating film, and in an area outside of the pixel unit, (i) a conductive film at least partially covered by the third insulating film is formed on the second insulating film, and (ii) the third insulating film formed on the conductive film and on the second insulating film near the conductive film has a film thickness smaller than a film thickness of the partition.

13 Claims, 18 Drawing Sheets

(52) U.S. Cl.
CPC .... *H01L27/14627* (2013.01); *H01L 27/14632* (2013.01); *H01L 27/14645* (2013.01); *H01L 27/14685* (2013.01)

(56) References Cited

U.S. PATENT DOCUMENTS

2006/0158547 A1 7/2006 Komatsu et al.
2009/0278967 A1* 11/2009 Toumiya ................ 348/294
2010/0007779 A1* 1/2010 Nakata et al. ................ 348/294

FOREIGN PATENT DOCUMENTS

| JP | 2006-295125 | 10/2006 |
| JP | 2009-260089 | 11/2009 |
| JP | 2009-272568 | 11/2009 |
| JP | 2011-119445 | 6/2011 |
| JP | 2011-165791 | 8/2011 |

* cited by examiner

When a = 0 (before removal)
Removal area D (E)

When a = 0 (after removal)
Removal area D (E)

When a = T23 (before removal)
Removal area D (E)

When a = T23 (after removal)
Removal area D (E)

When a > T23 (before removal)
Removal area D (E)

When a > T23 (after removal)
Removal area D (E)

SOLID-STATE IMAGING DEVICE AND METHOD FOR MANUFACTURING THE SAME

CROSS REFERENCE TO RELATED APPLICATION

This is a continuation application of PU International Application No. PCT/JP2012/006547 filed on Oct. 12, 2012, designating the United States of America, which is based on and claims priority of Japanese Patent Application No. 2011-225587 filed on Oct. 13, 2011. The entire disclosures of the above-identified applications, including the specifications, drawings and claims are incorporated herein by reference in their entirety.

FIELD

The present disclosure relates to solid-state imaging devices and methods of manufacturing the solid-state imaging devices, and in particular to a solid-state imaging device which includes a partition between color filters and a method for manufacturing the solid-state imaging device.

BACKGROUND

In a solid-state imaging device including color filters each being formed to correspond to a different one of light receiving units that are formed on a semiconductor substrate, light sometimes obliquely enters a predetermined color filter. As a technology for reducing such light entering other color filters adjacent to the predetermined color filter or light receiving units corresponding to the adjacent color filters, a solid-state imaging device which includes a partition between the color filters is conventionally presented (for example, patent literature (PTL) 1).

FIG. 16 is a cross-sectional view of a solid-state imaging device according to PTL1, In a solid-state imaging device according to PTL1, a planarizing layer 103 is formed on a light receiving unit 101, and filters 107 to 110 formed above the light receiving unit 101 are separated by organic silicon material layers 104. In other words, partitions, namely, the organic silicon material layers 104 are arranged between the filters 107 to 110 corresponding to the light receiving unit 101

With this configuration, light that obliquely incident on a predetermined light receiving unit 101 is less likely to reach the light receiving unit 101 adjacent to the predetermined light receiving unit 101, because the oblique incident light is reflected by the partition (the organic silicon material layer 104) or enters into the partition (the organic silicon material layer 104) to be absorbed.

CITATION LIST

Patent Literature

[PTL 1]
Japanese Unexamined Patent Application Publication No. H03-282403

SUMMARY

Technical Problem

However, a film thickness and the like of the color filter become uneven in the above-described solid-state imaging device according to PTL 1, which causes color non-uniformity (image non-uniformity), such as a blotch, and is problematic.

In other words, the solid-state imaging device includes, in addition to a pixel unit, a light-shielding unit and a peripheral circuit unit. The light-shielding unit and the peripheral circuit unit include a line to shield light or a line used as a pad or the like. The thickness of such lines creates a significant difference in level in a base of the color filter in vicinity of boundary between (i) the light-shielding unit and the peripheral circuit unit which include lines and (ii) the pixel unit. Note that, the above-described partition is formed between the adjacent color filters in the pixel unit. Furthermore, a film (an organic silicon material layer 104) which forms the partition is also formed on the above-described lines in the light-shielding unit and the peripheral circuit unit.

In other words, when the partition and the color filter are formed in the pixel unit, the differences in level attributed to the lines are present in the light-shielding unit and the peripheral circuit unit. Due to the affect from the difference in level described above, a film of, for example, a resist material at the time of forming the partition, a color filter material, a material for forming a microlens, or the like, which is formed on the portion having a difference in level cannot be applied in a uniform thickness. This causes color non-uniformity, such as a blotch, in the pixel unit, which is problematic.

To address the above, reducing the line thickness is believed to be effective. However, the reducing of the line thickness leads to an increase in a resistance value and also deterioration of light-shielding property of the line, which is problematic.

The present disclosure has been conceived to address the above, and one non-limiting and exemplary embodiment reduces the difference in level on the surface which is made when the partition is formed in the solid-state imaging device including the partition between the color filters.

Solution to Problem

A solid-state imaging device according to an aspect of the present disclosure is a solid-state imaging device including a pixel unit, the solid-state imaging device including: a semiconductor substrate; a first insulating film formed above the semiconductor substrate; a second insulating film formed on the first insulating film; and a third insulating film formed on the second insulating film, wherein in the pixel unit, the semiconductor substrate is provided with a plurality of photodiodes, a portion of the first insulating film has a recess, the portion being located above each of the photodiodes, the second insulating film embeds the recess, a plurality of color filters are formed on the second insulating film, the color filters each corresponding to one of the photodiodes, a partition is provided between adjacent ones of the color filters, the partition being a part of the third insulating film, and the second insulating film in the recess forms an optical waveguide which guides light to the photodiode, and in an area outside of the pixel unit, a conductive film at least partially covered by the third insulating film is formed on the second insulating film, and the third insulating film formed on the conductive film and on the second insulating film near the conductive film has a film thickness smaller than a film thickness of the partition.

In the solid-state imaging device according to the aspect of the present disclosure, it may be that, in the area outside of the pixel unit, the third insulating film near the conductive film is provided with a groove, and out of inner wall surfaces of the groove, an inner wall surface on a far side as viewed from the conductive film is separated from the conductive film by a distance that is greater than or equal to the film thickness of the partition.

In the solid-state imaging device according to the aspect of the present disclosure, the third insulating film may be made of a film having a refractive index lower than a refractive index of the second insulating film.

In the solid-state imaging device according to the aspect of the present disclosure, the area outside of the pixel unit may include a light-shielding unit, and the conductive film may be a light-shielding film formed in the light-shielding unit.

In the solid-state imaging device according to the aspect of the present disclosure, it may be that the area outside of the pixel unit includes a peripheral circuit unit, the peripheral circuit unit includes: a line formed in the first insulating film; and a pad electrode which is formed on the line and is electrically connected to the line, and the conductive film is the pad electrode.

In the solid-state imaging device according to the aspect of the present disclosure, it may be that the area outside of the pixel unit includes a light-shielding unit and a peripheral circuit unit formed outside the light-shielding unit, the conductive film includes a first conductive film and a second conductive film, the first conductive film is a light-shielding film formed in the light-shielding unit, the peripheral circuit unit includes: a line formed in the first insulating film; and a pad electrode which is formed on the line and is electrically connected to the line, and the second conductive film is the pad electrode.

In the solid-state imaging device according to the aspect of the present disclosure, it may be that, in the area outside of the pixel unit, a portion of the third insulating film formed on the second insulating film near the conductive film has a film thickness smaller than a film thickness of the partition, the portion being formed around the conductive film.

In the solid-state imaging device according to the aspect of the present disclosure, a fourth insulating film between the second insulating film and the third insulating film may be further included, wherein the conductive film may be formed on the fourth insulating film, and in the pixel unit, the color filter may be formed which penetrates the third insulating film and the fourth insulating film.

In the solid-state imaging device according to the aspect of the present disclosure, the conductive film may be a single layer film including aluminum.

In the solid-state imaging device according to the aspect of the present disclosure, the conductive film may be a stacked film which includes at least a film including aluminum.

Furthermore, a method for manufacturing a solid-state imaging device according to an aspect of the present disclosure is a method for manufacturing a solid-state imaging device including a pixel unit, the method including: forming a plurality of photodiodes in the pixel unit in a semiconductor substrate; forming, on the semiconductor substrate, a first insulating film which covers the photodiodes; selectively forming a recess in a portion of the first insulating film, the portion being located above each of the photodiodes; forming an optical waveguide by forming, on the first insulating film, a second insulating film which embeds the recess, the optical waveguide guiding light to a corresponding one of the photodiodes; forming a conductive film on the second insulating film in an area outside of the pixel unit; forming a third insulating film on the second insulating film and on the conductive film; reducing a film thickness of the third insulating film formed on the conductive film and near the conductive film in the area outside of the pixel unit; and forming, in the pixel unit, a partition which penetrates the third insulating film.

In the method for manufacturing the solid-state imaging device according to the aspect of the present disclosure, it may be that the area outside of the pixel unit includes a light-shielding unit and a peripheral circuit unit formed outside the light-shielding unit, in the forming of a conductive film, a first conductive film and a second conductive film are each formed as the conductive film, the first conductive film is formed in the light-shielding unit, and the second conductive film is formed in the peripheral circuit unit.

The method for manufacturing the solid-state imaging device according to the aspect of the present disclosure may further include forming a line in the first insulating film in the peripheral circuit unit, wherein the second conductive film may be formed to electrically connect to the line.

Advantageous Effects

A solid-state imaging device and a method for manufacturing the solid-state imaging device according to an aspect of the present disclosure can reduce, in a light-shielding unit and a peripheral circuit unit outside a pixel unit, a difference in level attributed to the thicknesses of a conductive film, such as the light-shielding film or the pad electrode, and thus formation of a partition or a color filter in the pixel unit can be conducted with a smaller difference in level in the base. With this, each of the materials can be uniformly formed in each of the pixels on a wafer and thus image non-uniformity, such as a blotch, does not occur, enabling provision of a solid-state imaging device with superior property.

BRIEF DESCRIPTION OF DRAWINGS

These and other objects, advantages and features of the present disclosure will become apparent from the following description thereof taken in conjunction with the accompanying drawings that illustrate a specific embodiment of the present disclosure.

DESCRIPTION OF EMBODIMENT

Figure 1:
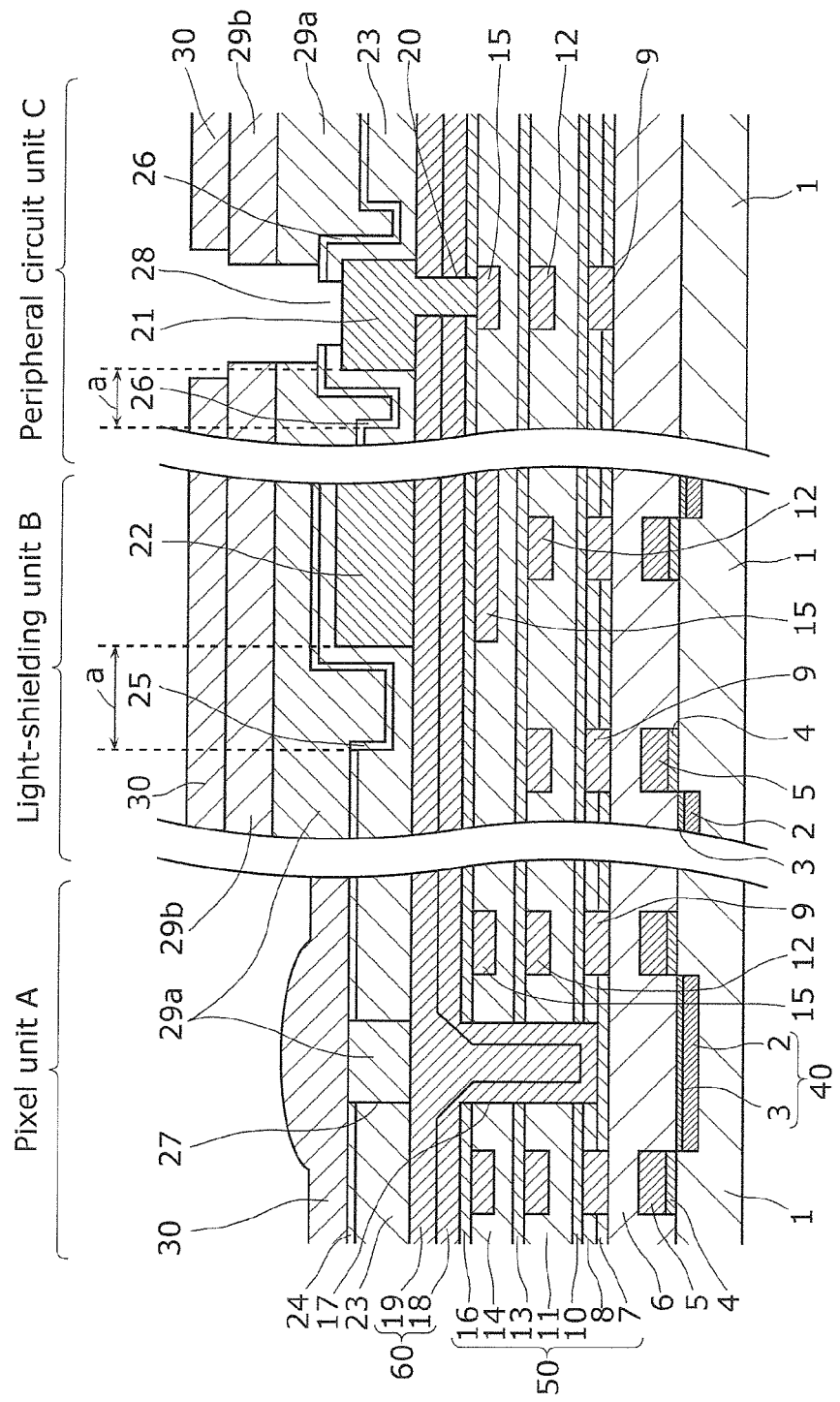
FIG. 1 is a schematic cross-sectional view of a main part of a solid-state imaging device according to an embodiment.

Hereinafter, a certain exemplary embodiment is described in greater detail with reference to the accompanying Drawings. The exemplary embodiment described below shows a general or specific example. The numerical values, shapes, materials, structural elements, the arrangement and connection of the structural elements, steps, the processing order of the steps etc. shown in the following exemplary embodiment is a mere example, and therefore do not limit the scope of the present disclosure. The present disclosure is defined by Claims. Therefore, among the structural elements in the following exemplary embodiment, structural elements not recited in any one of the independent claims defining the most generic part of the inventive concept are not necessarily required to overcome conventional problem and are described as arbitrary structural elements. It is to be noted that in the Drawings, elements having substantially the same configurations, functions, and effects share the same reference numerals An Embodiment A solid-state imaging device according to an embodiment of the present disclosure is described with reference to FIG. 1 and FIG. 2.

Figure 2:
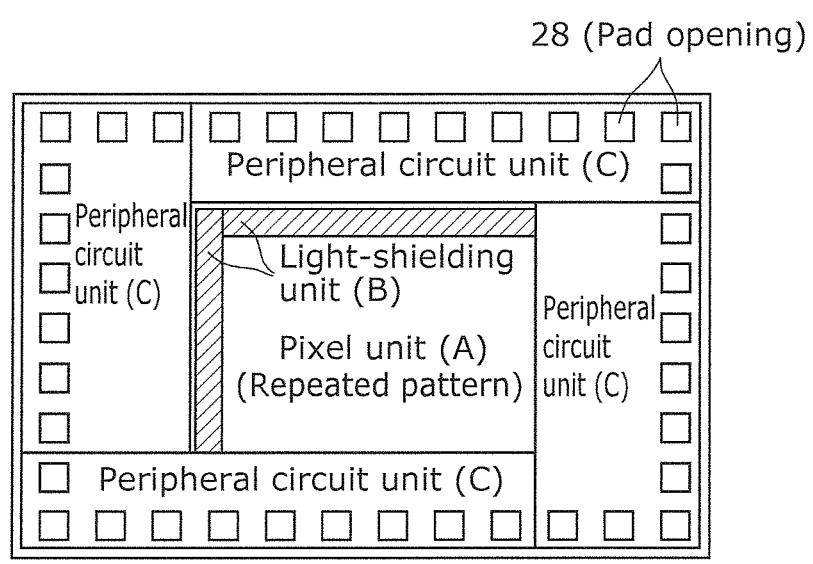
FIG. 2 is a schematic plan view of the entirety (a semiconductor chip) of the solid-state imaging device according to the embodiment.

FIG. 1 is a schematic cross-sectional view of a main part of the solid-state imaging device according to the embodiment. FIG. 2 is a schematic plan view of the entirety (a semiconductor chip) of the solid-state imaging device according to the embodiment. Note that, FIG. 2 shows, as a plan view, the entirety of the solid-state imaging device from above.

As shown in FIG. 1, the solid-state imaging device according to the embodiment includes a pixel unit A, a light-shielding unit B, and a peripheral circuit unit C which are separated sections on a semiconductor substrate 1 that includes silicon (Si) or the like.

As shown in FIG. 2, the light-shielding unit B is disposed on a portion of the periphery of the pixel unit A, and the peripheral circuit unit C is disposed on the periphery of the pixel unit A and the light-shielding unit B.

First, a configuration of the pixel unit A is described.

The pixel unit A includes a photodiode 40 which includes an n-type layer 2 formed in the upper portion of a semiconductor substrate 1 and a p-type layer 3 formed on the n-type layer 2. In the pixel unit A, a plurality of the photodiode 40 are two dimensionally arranged (i.e., arranged in rows and columns).

On the semiconductor substrate 1, a plurality of transistors including gate electrodes 5 are formed via gate insulating films 4 to be adjacent to the photodiodes 40. Each of the transistors reads charge which is accumulated in the photodiode 40 as a result of photoelectric conversion of incident light. The gate insulating film 4 may be a silicon oxide or the like, and the gate electrode 5 may include a polysilicon or the like.

A lower layer insulating film 6 which includes a silicon oxide ($SiO_2$) or the like and has a planarized upper surface is formed on the entirety of the semiconductor substrate 1 to cover the transistors and the photodiodes 40. An underlying insulating film 7 including a silicon nitride (SiN), a silicon carbonitride (SiCN), or the like is formed on the lower layer insulating film 6.

A first interlayer insulating film 8, a second interlayer insulating film 11, and a the third interlayer insulating film 14 each including a silicon oxide or the like are sequentially formed on the underlying insulating film 7. A first internal line 9 is formed in an area which is above the gate electrode 5 and in the first interlayer insulating film 8. Likewise, a second internal line 12 is formed in an area which is above the first internal line 9 and in the second interlayer insulating film 11, and a third internal line 15 is formed in an area which is above the second internal line 12 and in the third interlayer insulating film 14. Here, each of the first internal line 9, the second internal line 12, and third internal line 15 may be, for example, copper (Cu) or a metal including as a main component copper.

A first liner film 10 which covers the upper surface of the first internal line 9 is formed between the first interlayer insulating film 8 and the second interlayer insulating film 11. Likewise, a second liner film 13 which covers the upper surface of the second internal line 12 is formed between the second interlayer insulating film 11 and the third interlayer insulating film 14, and a third liner film 16 which covers the upper surface of the third internal line 15 is formed on the third interlayer insulating film 14. Here, each of the first liner film 10, the second liner film 13, and the third liner film 16 includes, for example, a silicon nitride (SiN), a silicon carbonitride (SiCN), or the like, and functions as a diffusion barrier film for copper atoms included in the first internal line 9, the second internal line 12, and the third internal line 15.

The underlying insulating film 7, the first interlayer insulating film 8, the second interlayer insulating film 11, the third interlayer insulating film 14, the first liner film 10, the second liner film 13, and the third liner film 16 which are stacked on the lower layer insulating film 6 is called a first insulating film 50 for convenience, In the area which is above the photodiode 40 and in the first insulating film 50, a recess 17 which forms an optical waveguide is formed. A second insulating film 60 which includes, for example, a silicon nitride (SiN) is formed on the first insulating film 50 to embed the recess 17. The second insulating film 60 is also formed to contact the upper surface of the first insulating film 50 outside the recess 17. Here, the second insulating film 60 includes: a first embedded layer 18 having a film thickness of, for example, 600 nm; and a second embedded layer 19 formed on the first embedded layer 18. Moreover, processing so-called shoulder etching is performed with which the wall surface widens toward the top at a peripheral portion of the upper end (opening) of the recess 17 in the first embedded layer 18. The second insulating film 60 formed in the recess 17 forms an optical waveguide which guides light to the photodiode 40.

In an area on the second insulating film 60 in the pixel unit A, a third insulating film 23 for forming a partition is formed. The third insulating film 23 includes, for example, a silicon oxide (SiO).

A partition groove 27 is formed in the third insulating film 23 above the recess 17. A corresponding color filter, such as a blue filter, a red filter, a green filter, or the like, is formed in the partition groove 27, FIG. 1 shows an example in which a blue filter 29a is formed. More specifically, a partition composed of the third insulating film 23 is provided between adjacent color filters. Here, before forming the color filter, a planarizing film including, for example, an organic type resin may be formed on the second insulating film 60.

On the blue filter 29a, a microlens 30 which is for collecting light and includes a material such as an organic polymer or the like is formed to be upwardly convex, Next, a configuration of the light-shielding unit B is described.

The light-shielding unit B is arranged to surround the pixel unit A in two sides as shown in FIG. 2. Here, in light-shielding unit B, a plurality of the pixels is arranged in rows and columns as with the pixel unit A as shown in FIG. 1.

Furthermore, as shown in FIG. 1, in the light-shielding unit B, the photodiode 40 and a plurality of the transistors each of which includes the gate insulating film 4 and the gate electrode 5 are formed on and in the upper portion of the semiconductor substrate 1 in a similar manner as the pixel unit A. Furthermore, on the semiconductor substrate 1, the lower layer insulating film 6, the first insulating film 50, and the second insulating film 60 are formed. In the first insulating film 50, the first internal line 9, the second internal line 12, the third internal line 15, the first liner film 10, the second liner film 13, and the third liner film 16 are formed. However, different from the pixel unit A, the recess 17 that forms the optical waveguide is not formed in the light-shielding unit B.

For the area of the first insulating film 50 where light is to be shielded, a light-shielding film 22 having a wide width is formed. The third internal line 15 or the like having a wide width may be provided below the light-shielding film 22, if necessary.

The third insulating film 23 is formed on the light-shielding film 22. In the third insulating film 23, a light-shielding film groove 25 is formed on the peripheral portion of the light-shielding film 22 to surround the light-shielding film 22. A distance a that is between the outer end of the light-shielding film groove 25 and the light-shielding film 22 is configured to be greater than a greatest film thickness of the third insulating film 23. Here, the outer end of the light-shielding film groove 25 refers to, out of inner wall surfaces of the light-shielding film groove 25, an inner wall surface on a far side as viewed from the light-shielding film 22. The light-shielding film groove 25 is formed in the third insulating film 23 which is the same continuous film as the insulating film that forms the partition groove 27. However, the light-shielding film groove 25 has a depth smaller than a depth of the partition groove 27, and the third insulating film 23 having a small thickness exists on the light-shielding film 22. In other words, the film thickness of the third insulating film 23 formed on the upper surface of the light-shielding film 22 and on the upper surface of the second insulating film 60 near the light-shielding film 22 is smaller than the film thickness of the partition (i.e., the film thickness of the third insulating film 23 in the pixel unit A). Here, the light-shielding film 22 may be, for example, aluminum (Al) or a metal including aluminum as a main component. The light-shielding film 22 may be a single layer film including, for example, aluminum, and may also be a stacked film which includes at least a film including aluminum. The light-shielding film 22 may be a stacked film in which, for example, a film including titanium and titanium nitride and a film of aluminum are sequentially formed. An anti-reflection film (metal cap) composed of titanium nitride, titanium, or the like may be formed on the aluminum included in the light-shielding film 22, if necessary.

Furthermore, as color filters, the blue filter 29a and a red filter 29b are formed to be stacked above the third insulating film 23. Stacking the color filters of two colors improves light-shielding property, but is not necessarily required. An extension part of the microlens 30 is formed on the blue filter 29a and the red filter 29b, which is not a passage of light. Thus, different from the pixel unit A, the extension part of the microlens 30 in the light-shielding unit B is not formed to be upwardly convex.

Next, a configuration of the peripheral circuit unit C is described.

As shown in FIG. 2, the peripheral circuit unit C is arranged to surround the pixel unit A or the light-shielding unit B. Different from the pixel unit A and the light-shielding unit B, the peripheral circuit unit C is not provided with a photodiode in the upper portion of the semiconductor substrate 1. On the semiconductor substrate 1, the lower layer insulating film 6, the first insulating film 50, and the second insulating film 60 are sequentially formed. In the first insulating film 50, as with the pixel unit A and the light-shielding unit B, the first internal line 9, the second internal line 12, the third internal line 15, the first liner film 10, the second liner film 13, and the third liner film 16 are formed, Furthermore, a pad electrode 21 is formed on the second insulating film 60, and the pad electrode 21 is connected to the third internal line 15 via a contact formed in a contact hole 20 formed in the second insulating film 60. As with the light-shielding unit B, the third insulating film 23 is formed on a portion of the upper surface of the pad electrode 21 and on the second insulating film 60 near the pad electrode 21. In the third insulating film 23, a pad electrode groove 26 is formed near the pad electrode 21 to surround the pad electrode 21. A distance a that is between the outer end of the pad electrode groove 26 and the pad electrode 21 is configured to be greater than the film thickness of the third insulating film 23. Here, the outer end of the pad electrode groove 26 refers to, out of inner wall surfaces of the pad electrode groove 26, an inner wall surface on a far side as viewed from the pad electrode 21. The pad electrode groove 26 is formed in the third insulating film 23 which is the same continuous film as the insulating film that forms the partition groove 27. However, the pad electrode groove 26 has a depth smaller than a depth of the partition groove 27, and the third insulating film 23 having a small thickness exists on the pad electrode 21. In other words, the film thickness of the third insulating film 23 formed on the upper surface of the pad electrode 21 and on the second insulating film 60 near the pad electrode 21 is smaller than the film thickness of the partition. The pad electrode 21 is for electrical connection with the outside of the solid-state imaging device. Here, for the contact formed in the contact hole 20 and for the pad electrode 21, aluminum (Al) or a metal including as a main component aluminum can be used, for example. The pad electrode 21 may be, for example, a single layer film including aluminum, and may also be a stacked film which includes at least a film including aluminum. The pad electrode 21 may be, for example, a stacked film in which a film including titanium and titanium nitride and a film of aluminum are sequentially formed. The pad electrode 21 may be a stacked film in which an anti-reflection film (a metal cap) composed of titanium nitride, titanium, or the like is also formed on the aluminum.

On the third insulating film 23, the color filters and an extension part of the microlens 30 are formed as with the light-shielding unit B. A pad opening 28 is provided which penetrates the third insulating film 23, the blue filter 29a, the red filter 29b, and the extension part of the microlens 30 to partially expose the pad electrode 21.

As described above, the solid-state imaging device according to this embodiment is a solid-state imaging device including the pixel unit A, and includes: the semiconductor substrate 1, the first insulating film 50 formed above the semiconductor substrate 1, the second insulating film 60 formed on the first insulating film 50, and the third insulating film 23 formed on the second insulating film 60. In the pixel unit A, the photodiodes 40 are formed in the semiconductor substrate 1, the first insulating film 50 includes, in a portion above each of the photodiodes 40, the recess 17, and the second insulating film 60 embeds the recess 17. Moreover, in the pixel unit A, on the second insulating film 60, a plurality of the color filters such as the red filter 29b, the blue filter 29a, and the like each corresponding to one of the photodiodes 40 is formed. A partition which is a part of the third insulating film 23 is provided between the adjacent color filters. The second insulating film 60 formed in the recess 17 forms an optical waveguide which guides light to the photodiode 40. On the other hand, in the area outside of the pixel unit A such as the light-shielding unit B, the peripheral circuit unit C, and the like, conductive films such as the pad electrode 21, the light-shielding film 22, and the like are formed on the second insulating film 60. The conductive films are at least partially covered by the third insulating film 23. The film thickness of the third insulating film 23 formed on the conductive films and on the second insulating film 60 near the conductive films is smaller than the film thickness of the partition (the third insulating film 23 in the pixel unit A).

Furthermore, in the solid-state imaging device according to this embodiment, in the area outside of the pixel unit A, grooves such as the light-shielding film groove 25, the pad electrode groove 26, and the like are formed in the third insulating film 23 near the conductive films, and a distance a from, out of the inner wall surfaces of the groove, the inner wall surface on a far side as viewed from the conductive film to the conductive film, is greater than or equal to the film thickness of the partition.

Furthermore, in the solid-state imaging device according to this embodiment, the third insulating film 23 is made of a film having a smaller refractive index than the second insulating film 60.

Furthermore, in the solid-state imaging device according to this embodiment, the area outside of the pixel unit A includes the light-shielding unit B, and the conductive film is the light-shielding film 22 formed in the light-shielding unit B, Furthermore, in the solid-state imaging device according to this embodiment, the area outside of the pixel unit A includes the peripheral circuit unit C. The peripheral circuit unit C includes (i) the first internal line 9, the second internal line 12, the third internal line 15, and the like, which are lines formed in the first insulating film 50 and (ii) the pad electrode 21 which is formed on the lines and is electrically connected to the lines, and the conductive film is the pad electrode 21.

Furthermore, in the solid-state imaging device according to this embodiment, the area outside of the pixel unit A includes the light-shielding unit B and the peripheral circuit unit C formed outside the light-shielding unit B, the conductive film includes a first conductive film and a second conductive film, the first conductive film is the light-shielding film 22 formed in the light-shielding unit B, the peripheral circuit unit C includes the lines formed in the first insulating film 50 and the pad electrode 21 which is formed on the lines and is electrically connected to the lines, and the second conductive film is the pad electrode 21.

Furthermore, in the solid-state imaging device according to this embodiment, in the area outside of the pixel unit A, a portion of the third insulating film 23 (the third insulating film 23 where the light-shielding film groove 25 and the pad electrode groove 26 are formed) which is formed on the second insulating film 60 near the conductive film and has a film thickness smaller than the film thickness of the partition is formed around the conductive film.

Furthermore, in the solid-state imaging device according to this embodiment, the conductive film is a single layer film including aluminum.

Furthermore, in the solid-state imaging device according to this embodiment, the conductive film is a stacked film which includes at least a film including aluminum.

In this manner, in the light-shielding unit B and the peripheral circuit unit C, the film thickness of the third insulating film 23 which is formed on the light-shielding film 22, on the pad electrode 21, and on the second insulating film 60 near the light-shielding film 22 and the pad electrode 21 is reduced. Thus, the difference in level attributed to the thicknesses of the light-shielding film 22 and the pad electrode 21 formed in the light-shielding unit B and the peripheral circuit unit C can be reduced, enabling formation of the partition, a color filter, and a microlens with a smaller difference in level in the base. With this, each of the materials can be uniformly formed in each of the pixels on a wafer and thus image non-uniformity, such as a blotch, does not occur, enabling provision of a solid-state imaging device with superior property.

The following describes, with reference to FIG. 3 to FIG. 11, a method for manufacturing the solid-state imaging device which is shown in each of FIG. 1 and FIG. 2 and has the above-described structure. FIG. 3 to FIG. 11 are schematic cross-sectional views showing, according to an order of process, a method for manufacturing the main part of the solid-state imaging device according to an embodiment.

Figure 3:
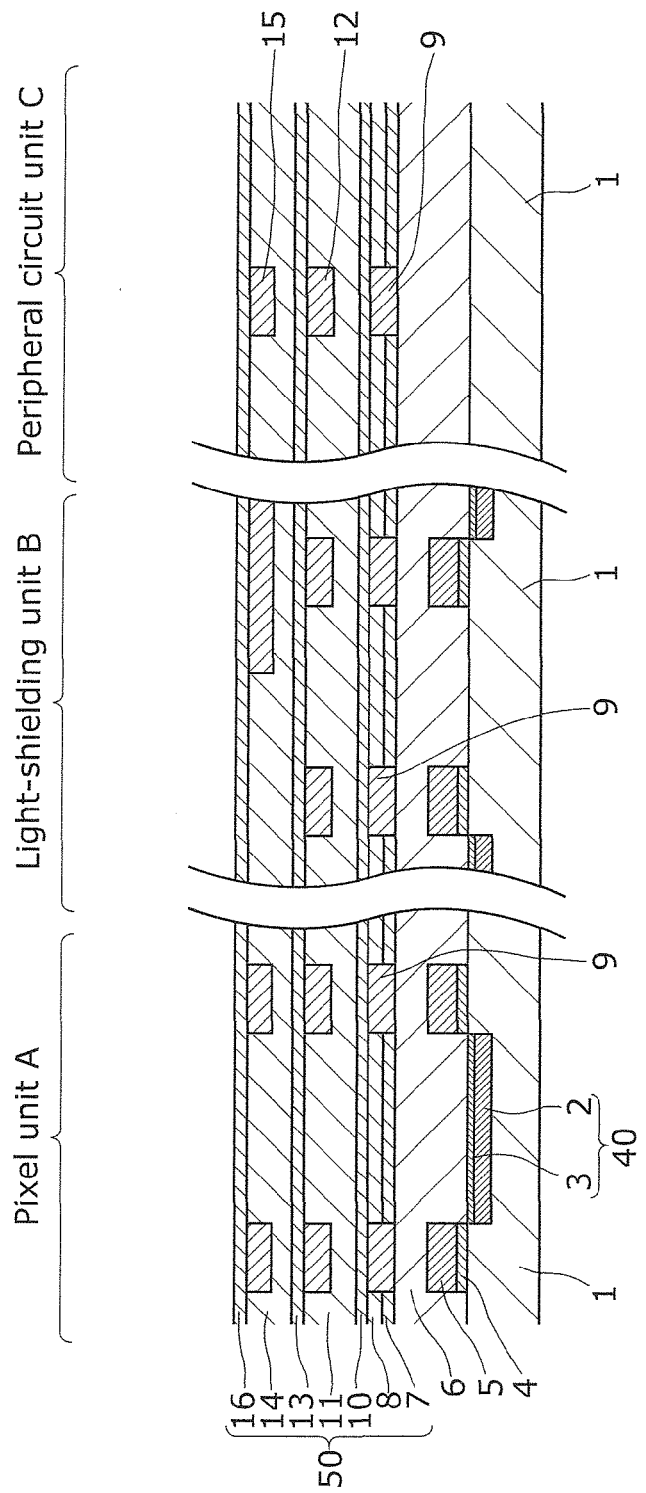
FIG. 3 is a schematic cross-sectional view showing, according to an order of process, a method for manufacturing the main part of the solid-state imaging device according to the embodiment.

First, as shown in FIG. 3, in the pixel unit A and the light-shielding unit B, the photodiodes 40 each of which includes the n-type layer 2 and the p-type layer 3 are selectively formed in the upper portion of the semiconductor substrate 1 by ion implementation or the like. After this, the gate insulating film 4 and the gate electrode 5 are selectively formed adjacent to the photodiodes 40. On the other hand, in the peripheral circuit unit C, an n-type or a p-type transistor is formed using ion implementation, the gate insulating film 4, the gate electrode 5, and the like (transistor is not shown in the drawing). Subsequently, the lower layer insulating film 6 is deposited on the entirety of the semiconductor substrate 1. Subsequently, the entirety of the upper surface of the deposited lower layer insulating film 6 is planarized using a chemical mechanical polishing (CMP) method, a resist etch-back method, or the like.

Subsequently, the underlying insulating film 7 is formed on the entirety of the lower layer insulating film 6. Subsequently, the first interlayer insulating film 8, the first internal line 9, and the first liner film 10 are sequentially formed on the underlying insulating film 7. With this process, in the pixel unit A, the light-shielding unit B, and the peripheral circuit unit C, a line in the first layer among the lines in multiple layers (three layers) are formed. After this, the second interlayer insulating film 11, the third interlayer insulating film 14, the second internal line 12, the third internal line 15, the second liner film 13, and the third liner film 16 that form lines in the second layer and the third layer are formed in a similar manner as the first layer.

Figure 4:
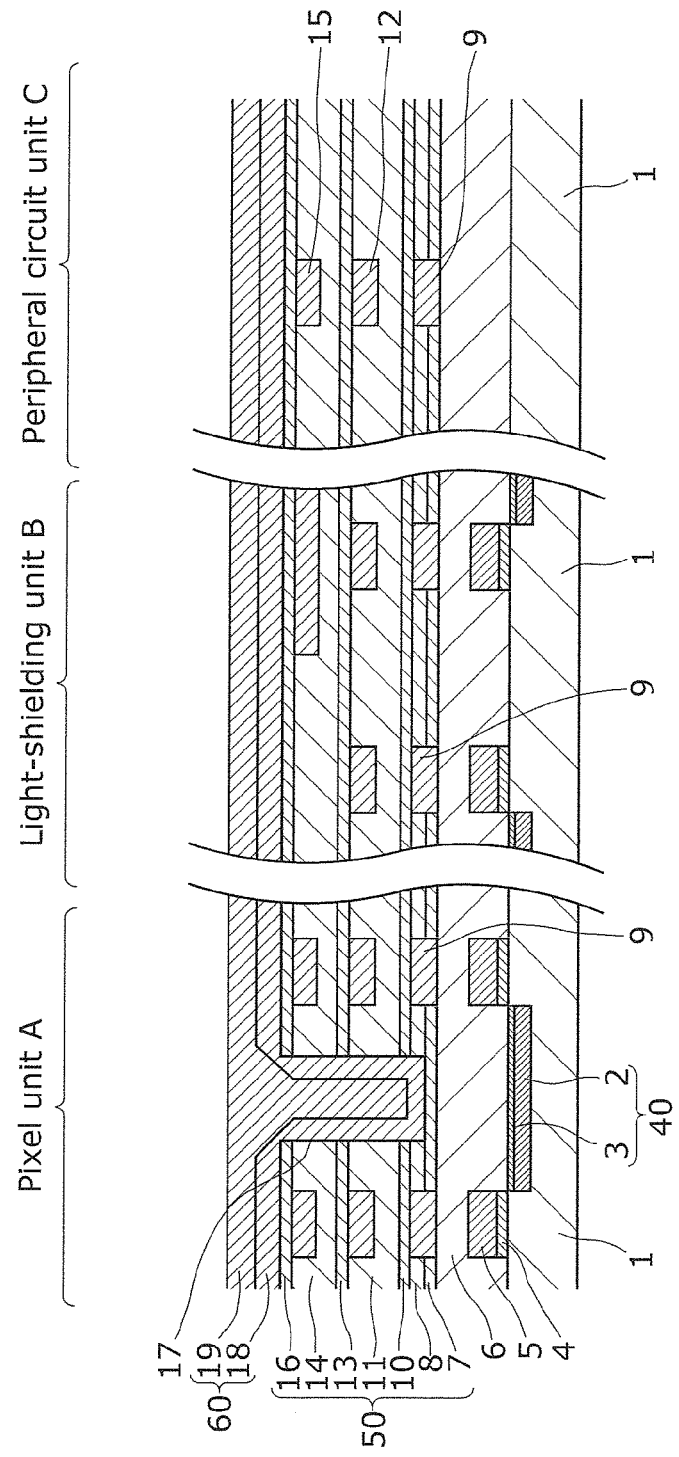
FIG. 4 is a schematic cross-sectional view showing, according to the order of process, the method for manufacturing the main part of the solid-state imaging device according to the embodiment.

Subsequently, as shown in FIG. 4, in the pixel unit A, the recess 17 for forming the optical waveguide is selectively formed by lithography, etching, and the like in a portion which is above the photodiode 40 and in the first insulating film 50 including insulating films that are the underlying insulating film 7 to the third liner film 16. At this time, the recess 17 that is the optical waveguide is not formed in the first insulating film 50 in the light-shielding unit B and the peripheral circuit unit C.

Next, for example by plasma CVD, the first embedded layer 18 which includes, for example, silicon nitride having a thickness of 600 nm is formed on the third liner film 16 in the pixel unit A, the light-shielding unit B, and the peripheral circuit unit C to cover the base and the wall surface of the recess 17 and the upper surface of the third liner film 16. The silicon nitride formed here has a refractive index in the approximate range of 1.9 to 1.95, for example.

Next, by Ar sputter etching or the like, shoulder etching is performed on an upper portion (edge of the opening) of the recess 17 in the first embedded layer 18 to form the first embedded layer 18 having the peripheral portion of the upper portion (the edge of the opening of the recess in the first embedded layer 18) which widens toward the top. Next, again by plasma CVD or the like, the second embedded layer 19 which includes, for example, silicon nitride having a thickness of approximately 1000 nm is formed on the first embedded layer 18 to embed the recess 17. For example, the silicon nitride included in the second embedded layer 19 also has a similar refractive index as the first embedded layer 18 that is in the approximate range of 1.9 to 1.95.

Next, the upper surface of the second embedded layer 19 formed above the entirety of the semiconductor substrate 1 is polished by CMP or the like for planarization, to remove the recess in the second embedded layer 19 above the recess 17.

Figure 5:
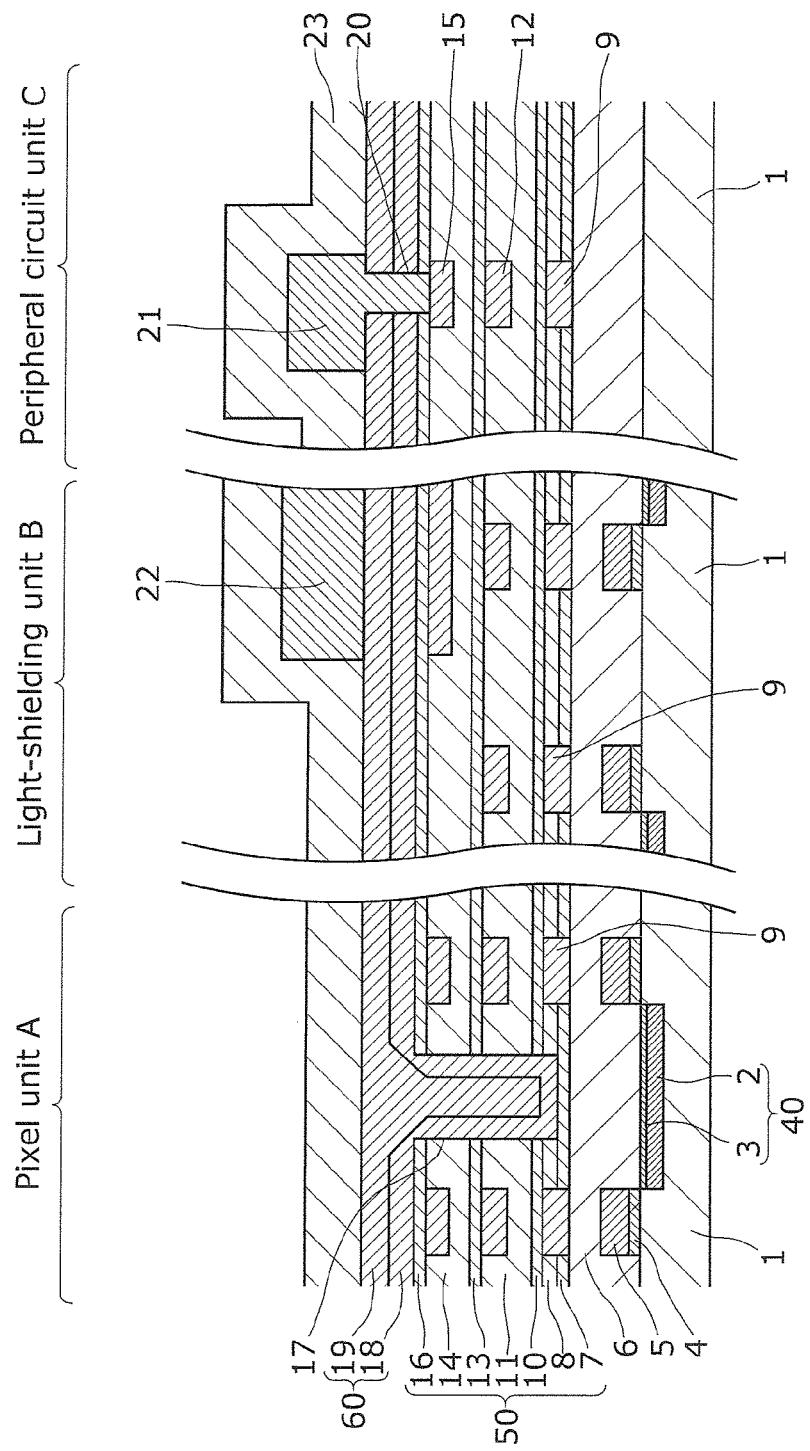
FIG. 5 is a schematic cross-sectional view showing, according to the order of process, the method for manufacturing the main part of the solid-state imaging device according to the embodiment.

Next, as shown in FIG. 5, in the peripheral circuit unit C, the contact hole 20 that exposes the third internal line 15 from the second insulating film 60 which includes insulating films of the first embedded layer 18 and the second embedded layer 19 is selectively formed by lithography, etching, and the like. In this embodiment, as shown in FIG. 2, the pad electrode 21 is provided only in the peripheral circuit unit C provided on the periphery. Thus, the contact hole 20 is also formed only in the peripheral circuit unit C.

Subsequently, a conductive film having the thickness of, for example, approximately 760 nm is formed on the second embedded layer 19 in the light-shielding unit B and the peripheral circuit unit C by lithography, sputtering, and the like. The conductive film becomes the light-shielding film 22 in the light-shielding unit B, and becomes the pad electrode 21 in the peripheral circuit unit C. The light-shielding film 22 and the pad electrode 21 can be formed by sequentially depositing, for example, titanium having a film thickness of approximately 160 nm, titanium nitride having a film thickness of approximately 100 nm, and aluminum having a film thickness of approximately 500 nm. Moreover, an anti-reflection film (metal cap) composed of titanium nitride, titanium, or the like may be formed on aluminum as necessary. At this time, the conductive film is not formed on the second embedded layer 19 in the pixel unit A.

Subsequently, the third insulating film 23 composed of, for example, silicon oxide having a film thickness of approximately 550 nm is formed over the entire surface from the pixel unit A to the peripheral circuit unit C. This film is for forming the partition in the pixel unit A, and becomes a film which protects the light-shielding film 22 and the pad electrode 21 respectively in the light-shielding unit B and the peripheral circuit unit C.

As a result, on the surface of the third insulating film 23 in the light-shielding unit B and the peripheral circuit unit C, compared to the surface of the pixel unit A, a difference in level is formed by the height of the light-shielding film 22 and the pad electrode 21. In other words, a difference in level as high as approximately 760 nm is formed in this embodiment. Note that, the difference in level attributed to the light-shielding film or the pad electrode is also formed in a similar manner even when the number of internal line layers in the pixel unit A and the number of internal line layers in the light-shielding unit B and the peripheral circuit unit C are different.

Figure 6:
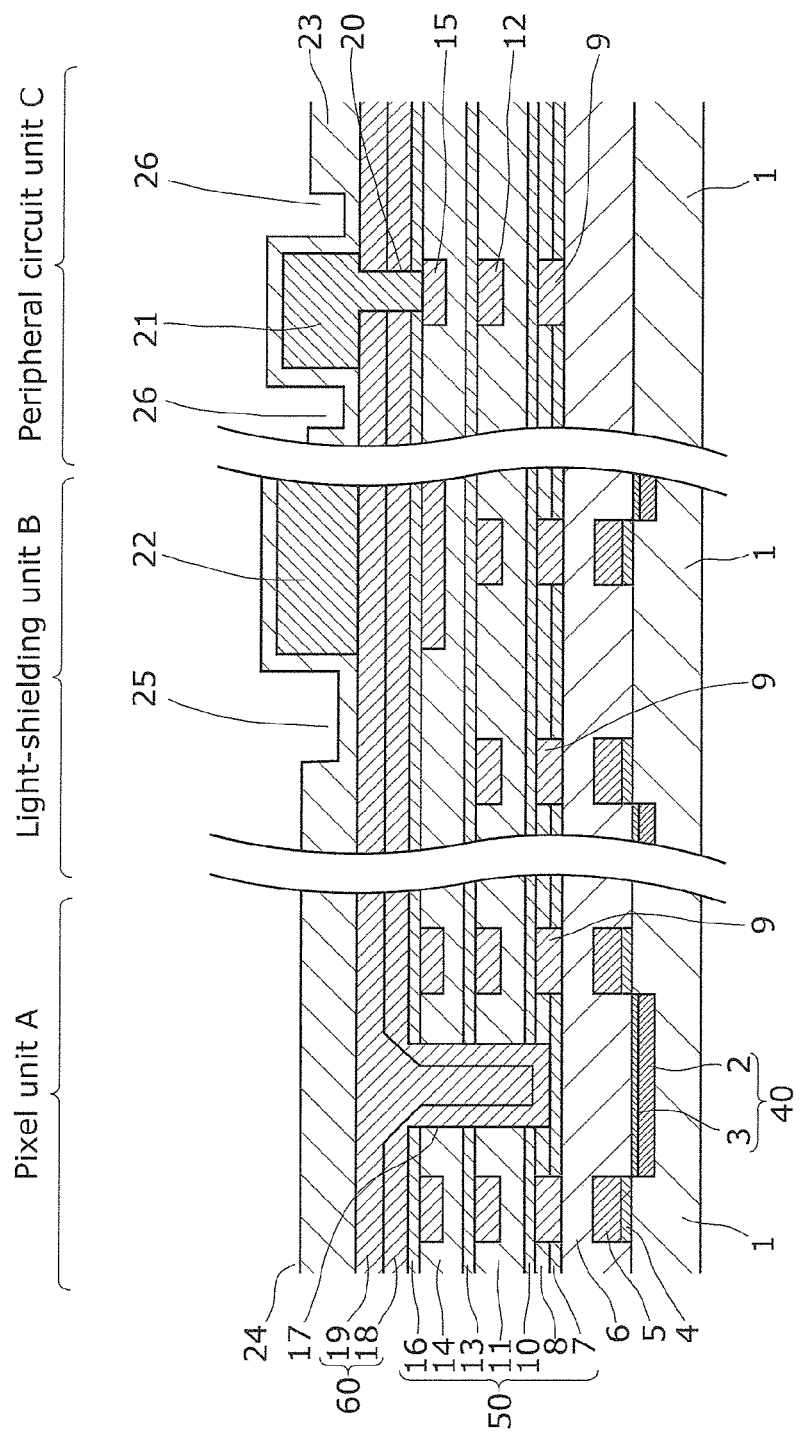
FIG. 6 is a schematic cross-sectional view showing, according to the order of process, the method for manufacturing the main part of the solid-state imaging device according to the embodiment.

Next, as shown in FIG. 6, lithography, etching, and the like, is performed on a wide area, which includes 2 to 3 μm away from the edge portions of the light-shielding film 22 and the pad electrode 21, from above the light-shielding film 22 and the pad electrode 21 in the light-shielding unit B and the peripheral circuit unit C to remove a portion of the surface of the third insulating film 23. The light-shielding film groove 25 and the pad electrode groove 26 are thus formed. Each of the light-shielding film groove 25 and the pad electrode groove 26 has a depth of, for example, approximately 400 nm. At this time, the third insulating film 23 formed on the light-shielding film 22 and the pad electrode 21 is not completely removed but partially left, and the film thickness of the third insulating film 23 formed on the light-shielding film 22 and the pad electrode 21 is approximately 150 nm, for example. The remaining thin third insulating film 23 can protect the light-shielding film 22 and the pad electrode 21.

Figure 7:
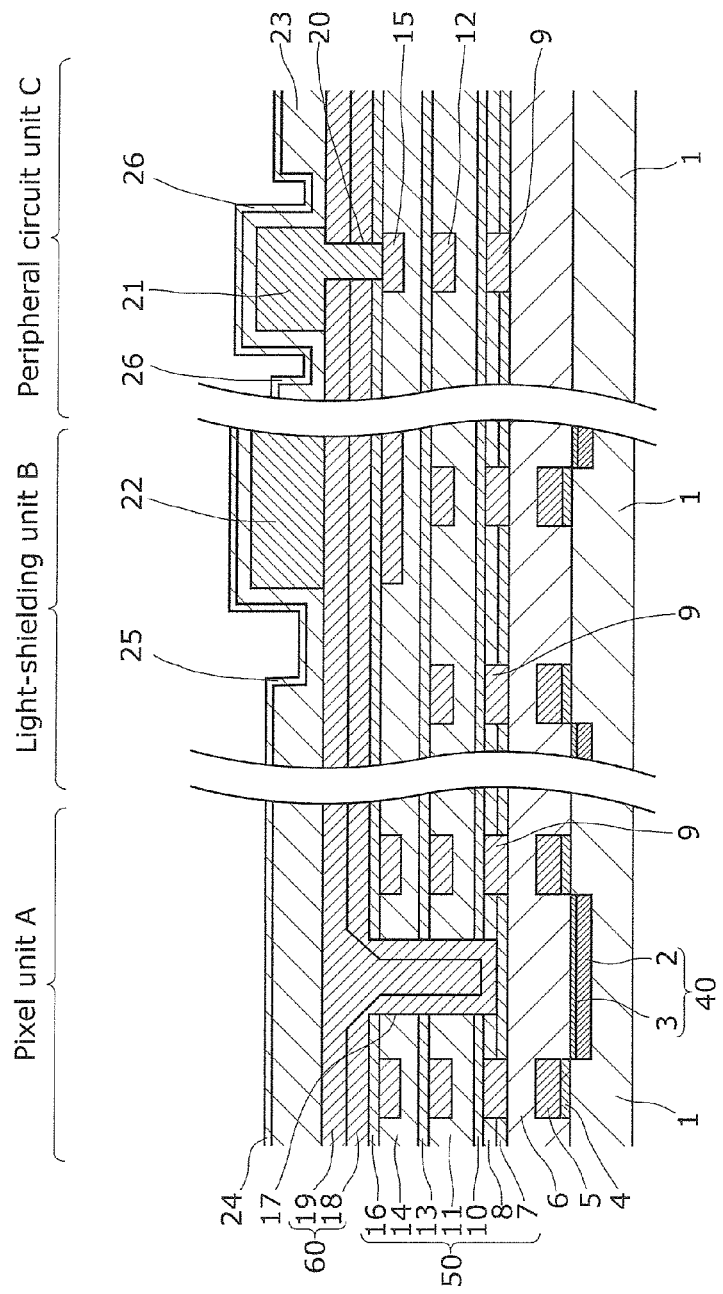
FIG. 7 is a schematic cross-sectional view showing, according to the order of process, the method for manufacturing the main part of the solid-state imaging device according to the embodiment.
Figure 8:
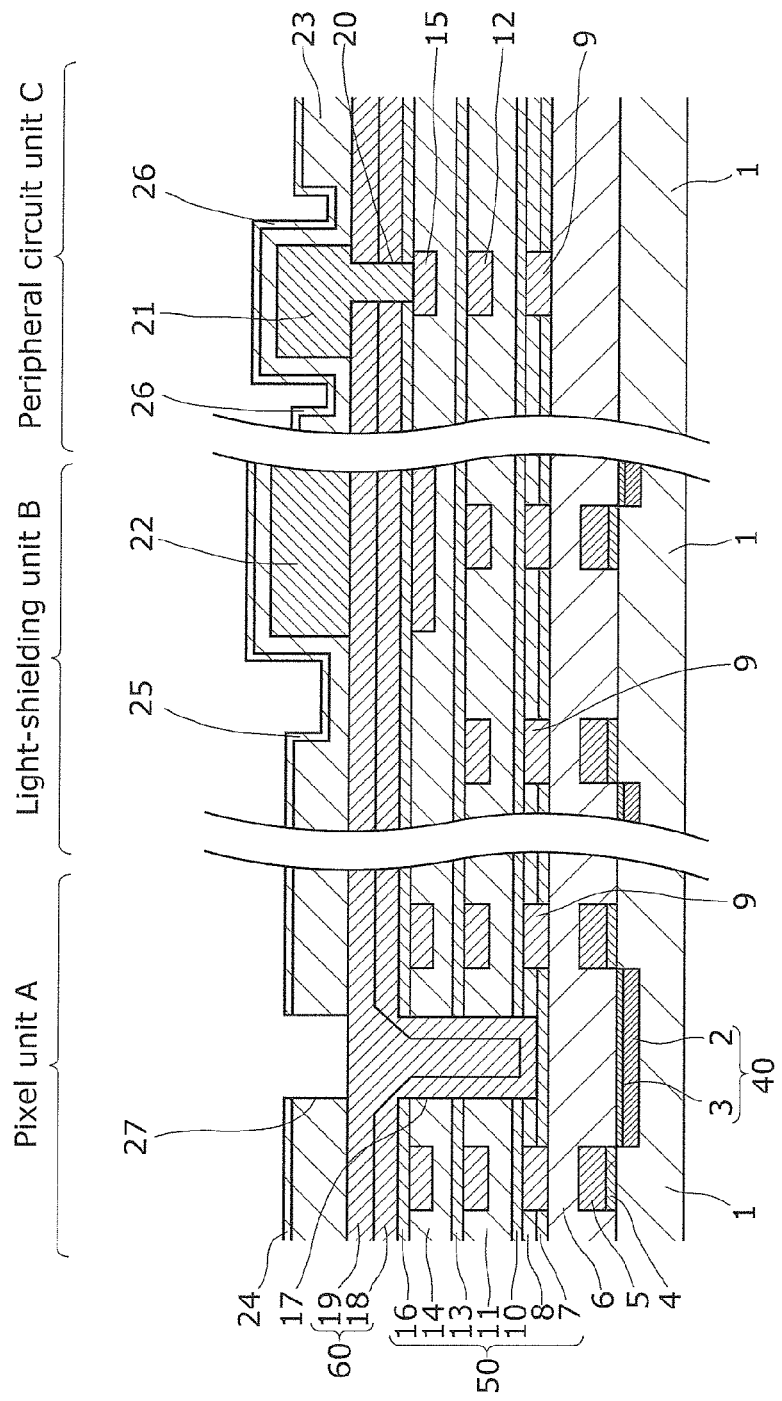
FIG. 8 is a schematic cross-sectional view showing, according to the order of process, the method for manufacturing the main part of the solid-state imaging device according to the embodiment.

Next, as shown in FIG. 7, an insulating film 24 composed of, for example, an silicon oxide having a film thickness of approximately 100 nm is formed on the entirety of the third insulating film 23. The silicon oxide is formed again because the thin third insulating film 23 remained on the light-shielding film 22 and the pad electrode 21 has been exposed to the etching when forming the light-shielding film groove 25 and the pad electrode groove 26 and thus the reliability of the light-shielding film 22 and the pad electrode 21 can deteriorate. The deterioration in reliability of the line, such as an aluminum line, or the like, can be reduced by newly forming the insulating film 24, Next, as shown in FIG. 8, in the pixel unit A, the partition groove 27 is formed to penetrate the third insulating film 23 and the insulating film 24 by lithography, etching, and the like. Here, the partition groove 27 is formed with a depth of 650 nm, for example. In the partition groove 27, a color filter is buried. In the plan view showing the solid-state imaging device from above, the partition groove 27 forms a lattice.

Figure 9:
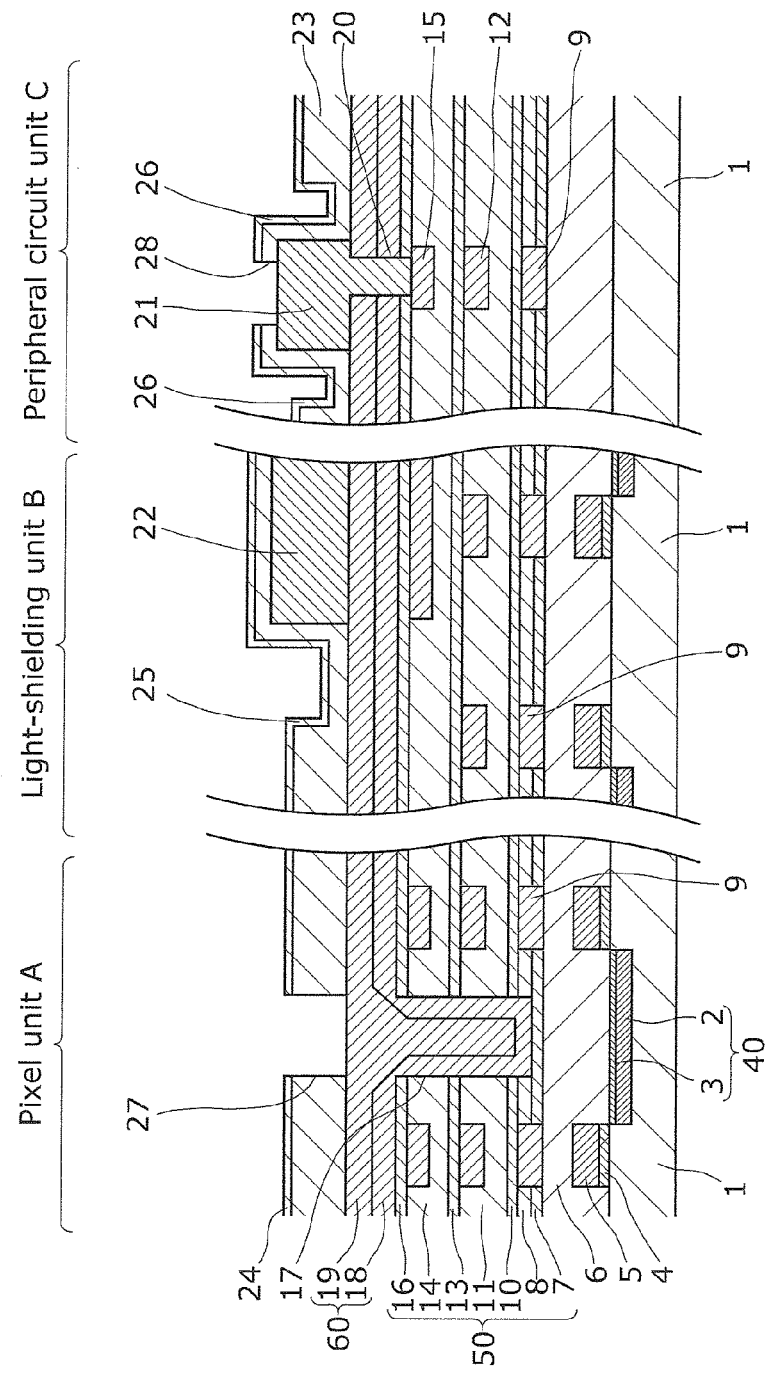
FIG. 9 is a schematic cross-sectional view showing, according to the order of process, the method for manufacturing the main part of the solid-state imaging device according to the embodiment.

Next, as shown in FIG. 9, in the peripheral circuit unit C, the pad opening 28 for wire bonding is formed to penetrate the third insulating film 23 and the insulating film 24 by lithography, etching, and the like.

Figure 10:
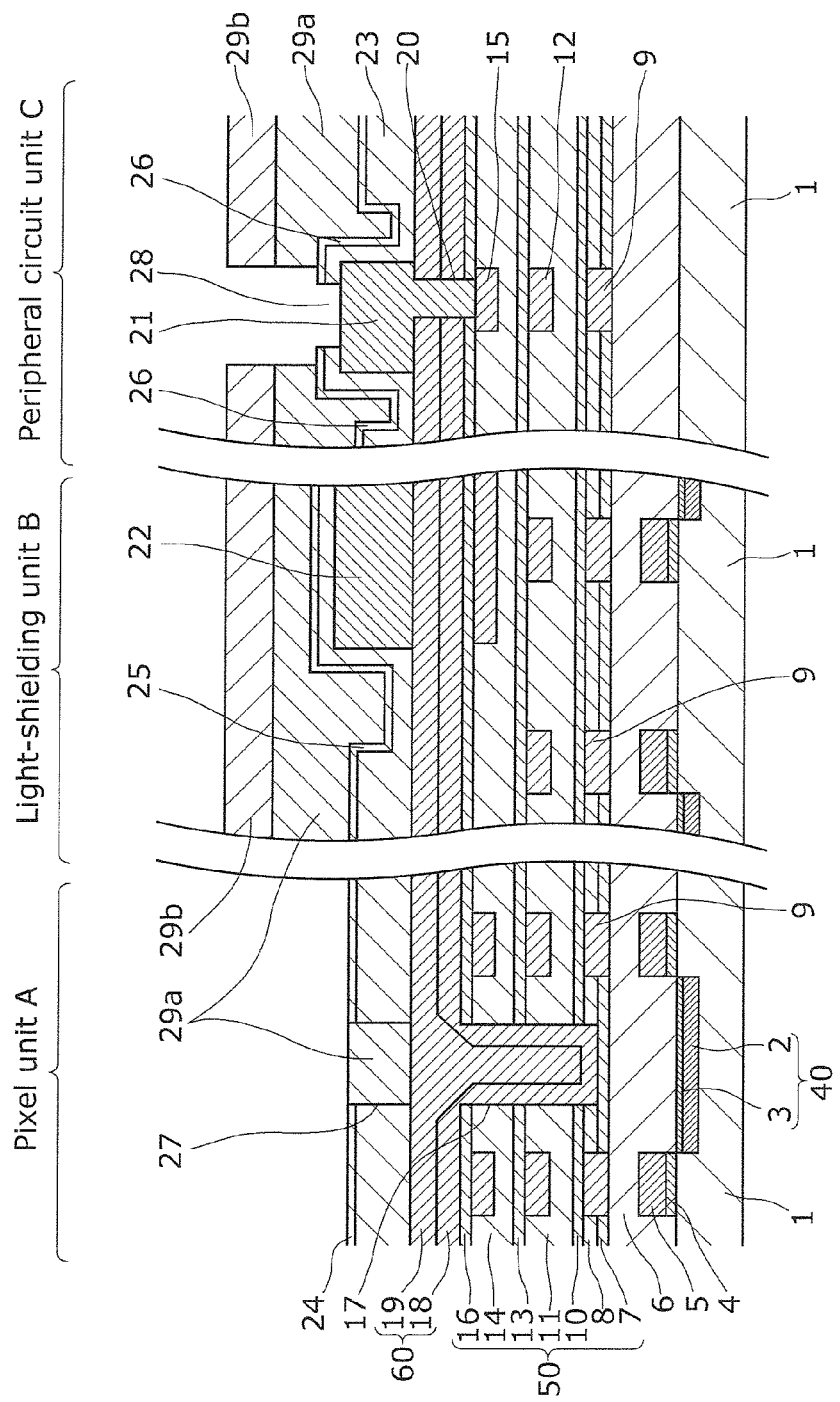
FIG. 10 is a schematic cross-sectional view showing, according to the order of process, the method for manufacturing the main part of the solid-state imaging device according to the embodiment.

Next, as shown in FIG. 10, color filters are formed in the order of, for example, a green filter, the blue filter 29a, and the red filter 29b (the green filter is not shown in the drawing). More specifically a color filter of a predetermined color is formed in each of the partition grooves 27 in the pixel unit A. The partition wall composed of the third insulating film 23 is provided between the adjacent color filters. FIG. 10 shows the case in which the blue filter 29a is formed in the partition groove 27 in the pixel unit A, and the blue filter 29a and the red filter 29b are formed to be stacked in the light-shielding unit B and the peripheral circuit unit C. In the pad opening 28, the blue filter 29a and the red filter 29b are not formed, which is realized by the removal by development.

Figure 11:
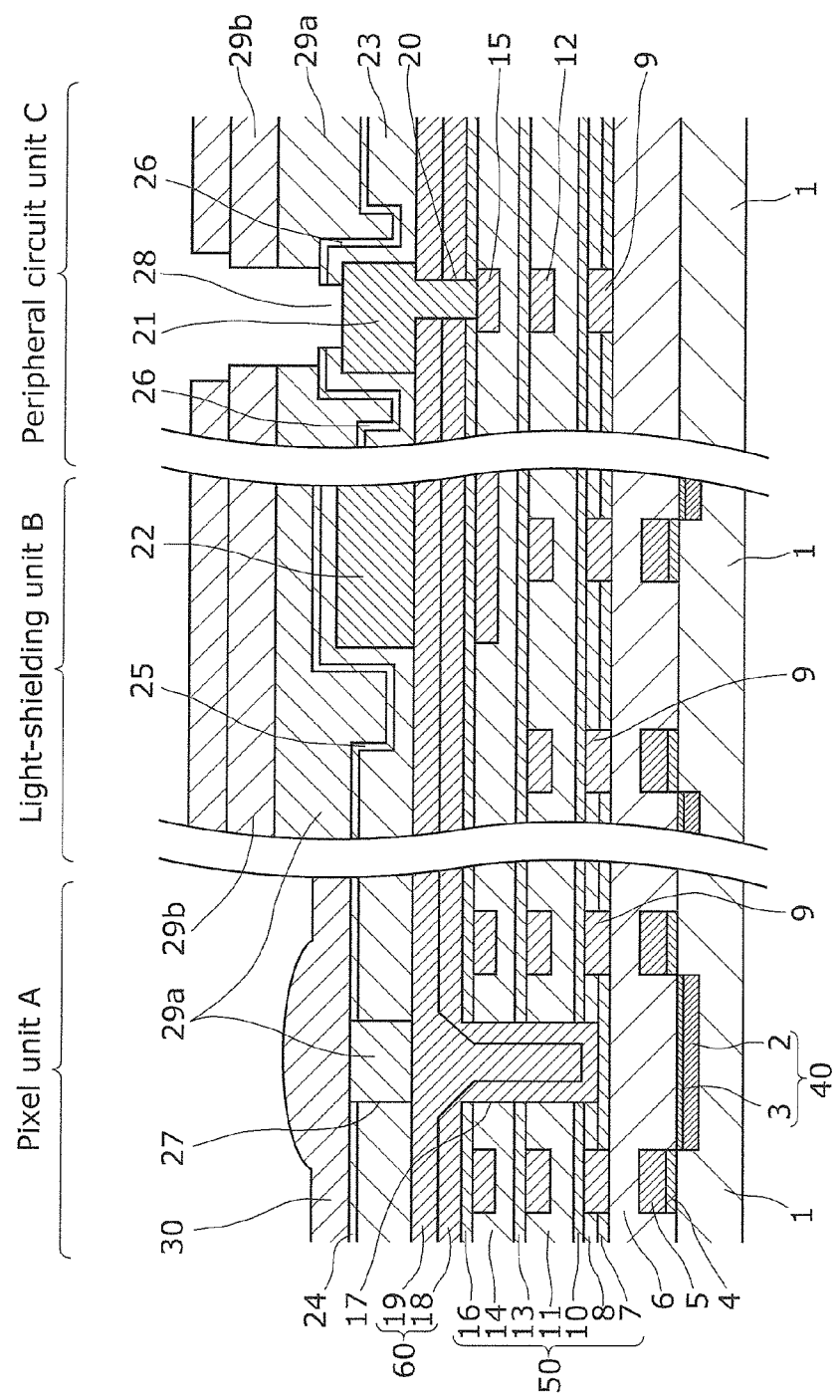
FIG. 11 is a schematic cross-sectional view showing, according to the order of process, the method for manufacturing the main part of the solid-state imaging device according to the embodiment.

Lastly, as shown in FIG. 11, the microlens 30 is formed. The microlens 30 is formed to be upwardly convex above the recess 17, which becomes the optical waveguide that is a passage of light, to improve the light collecting property. The extension part of the microlens 30 positioned above the pad electrode 21 is removed by lithography, etching, and the like to expose the pad electrode 21.

With the above manufacturing method, the solid-state imaging device shown in each of FIG. 1 and FIG. 2 can be obtained.

The following describes the details of the light-shielding film groove 25 and the pad electrode groove 26 formed in the solid-state imaging device according to this embodiment, and then describes a reason for the formation of the light-shielding film groove 25 and the pad electrode groove 26.

Figure 12:
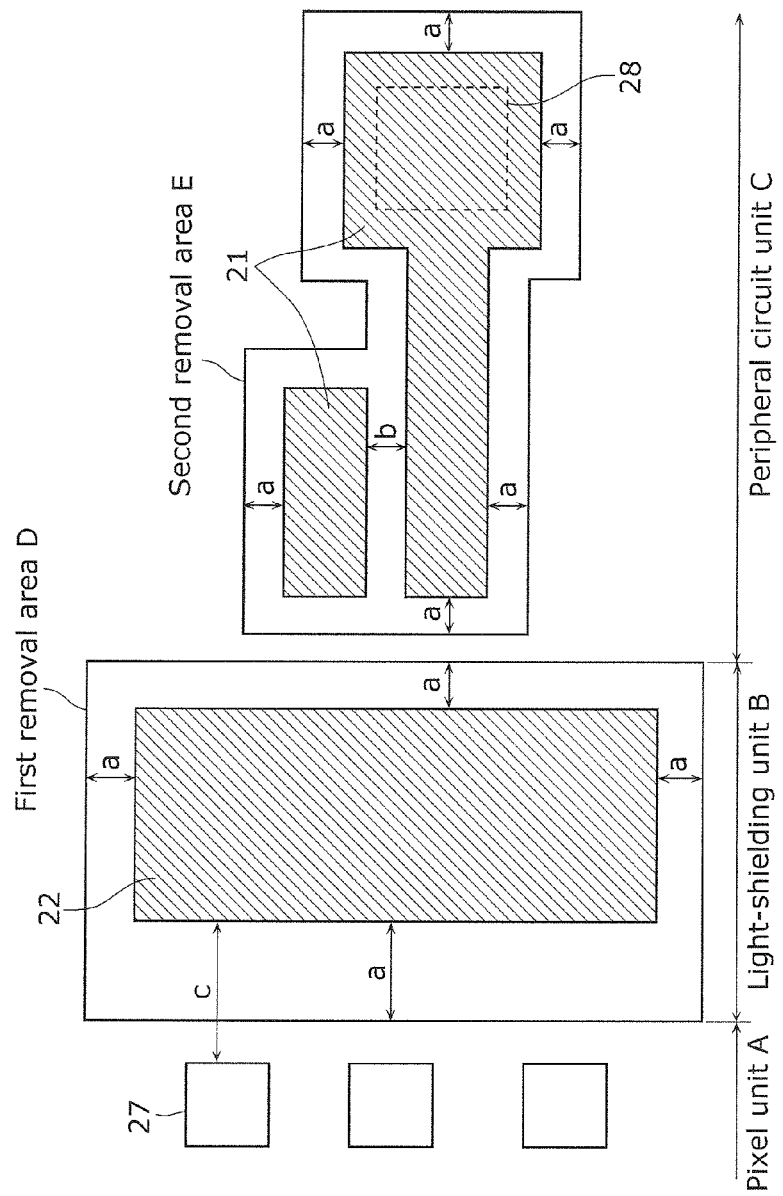
FIG. 12 shows plan views showing an example of a layout pattern of a first removal area and a second removal area.

First, an example of a layout pattern of the light-shielding film groove 25 and the pad electrode groove 26 is shown in FIG. 12. Note that, FIG. 12 is a planar view showing the pixel unit A, the light-shielding unit B, and the peripheral circuit unit C from above, In FIG. 12, the shaded area indicates the light-shielding film 22 and the pad electrode 21. Furthermore, the solid line formed to surround the light-shielding film 22 indicates the outer end (edge) of the area that is a portion of the third insulating film 23 to be removed (hereinafter a "first removal area D"). Furthermore, the solid line formed to surround the pad electrode 21 indicates the outer end (edge) of the area that is a portion of the third insulating film 23 to be removed (hereinafter a "second removal area E"). In the case of FIG. 12, the light-shielding film groove 25 and the pad electrode groove 26 are respectively formed in the inner part relative to the solid lines indicating the first removal area D and the second removal area E. Furthermore, the outer end of each of the first removal area D and the second removal area E is respectively formed to be larger than the light-shielding film 22 and the pad electrode 21 by a dimension (distance) a.

Figure 13A:
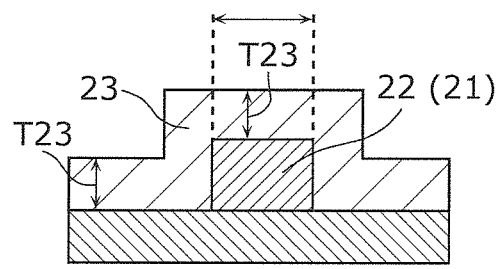
FIG. 13A is a diagram showing a result of study on widths of grooves of the first removal area and the second removal area.
Figure 13B:
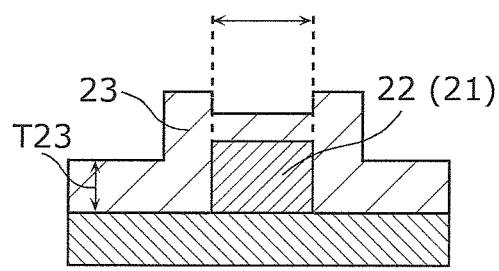
FIG. 13B is a diagram showing a result of study on the widths of the grooves of the first removal area and the second removal area.
Figure 13C:
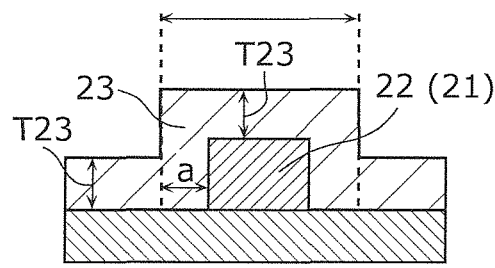
FIG. 13C is a diagram showing a result of study on the widths of the grooves of the first removal area and the second removal area.
Figure 13D:
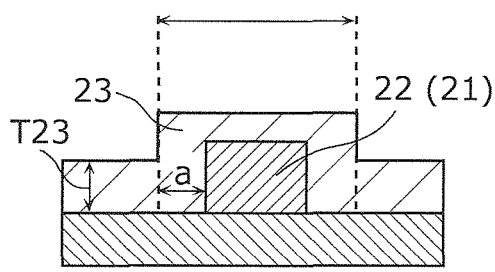
FIG. 13D is a diagram showing a result of study on the widths of the grooves of the first removal area and the second removal area.
Figure 13E:
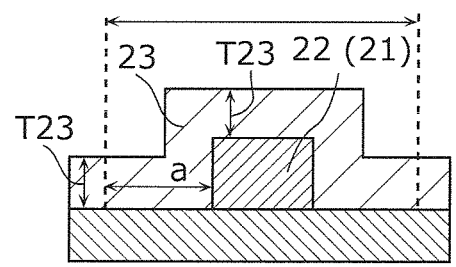
FIG. 13E is a diagram showing a result of study on the widths of the grooves of the first removal area and the second removal area.
Figure 13F:
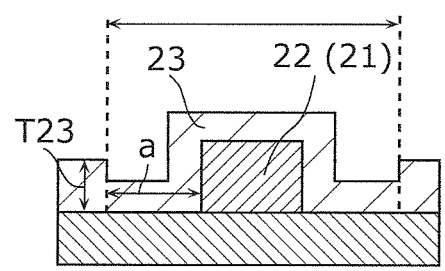
FIG. 13F is a diagram showing a result of study on the widths of the grooves of the first removal area and the second removal area.

Next, results of study on the widths of the groove of the first removal area D and the second removal area E are shown in FIG. 13A to FIG. 13F. Note that, each of FIG. 13A to FIG. 13F is a cross-sectional view showing an area which is to be removed and is a portion of the third insulating film 23 formed on the light-shielding film 22 or the pad electrode 21. In particular, each of FIG. 13A, FIG. 13C, and FIG. 13E is a cross-sectional view before formation of the first removal area D or the second removal area E for the third insulating film 23 formed on the light-shielding film 22 or the pad electrode 21. FIGS. 13B, 13D, and 13F are cross-sectional views after the formation of the first removal area D or the second removal area E, that is, after the partial removal of the third insulating film 23 is performed on FIGS. 13A, 13C, and FIG. 13E, respectively.

In each of FIG. 13A, FIG. 13C, and FIG. 13E, the third insulating film 23 is formed on the second insulating film 60 and on one of the light-shielding film 22 and the pad electrode 21. Here, the film thickness of the third insulating film 23 before the formation of the first removal area D or the second removal area E is assumed to be T23.

Each of FIG. 13A and FIG. 13B shows the case in which a (distance a in FIG. 1 and FIG. 12)=0, that is, the case in which the position of the outer end of the light-shielding film 22 and the position of the outer end of the first removal area D are the same. In this case, when the third insulating film 23 is partially removed, the third insulating film 23 after the removal has a shape in which the third insulating film 23 is remained to protrude at the periphery of the light-shielding film 22 as shown in FIG. 13B. In the case of T23>a>0 as well, the protruded portion remains as with the case of a=0. Note that, the situation is similar also in the case where the area of the first removal area D is smaller than the area of the light-shielding film 22 and the first removal area D is only on the light-shielding film 22. Here, a similar advantageous effect is also produced in the case where the pad electrode 21 is formed instead of the light-shielding film 22.

Each of FIG. 13C and FIG. 13D shows the case in which a=T23, that is, the case in which the distance from the outer end of the light-shielding film 22 to the outer end of the first removal area D is the same as the film thickness of the third insulating film 23. The third insulating film 23 on the light-shielding film 22 is formed with the film thickness of T23. Thus, when the adhering rate is assumed to be 100%, the third insulating film 23 having a film thickness of T23 is also formed on the side wall of the light-shielding film 22. In this case, when the third insulating film 23 is partially removed, as shown in FIG. 13D, the third insulating film 23 formed on the light-shielding film 22 has a smaller thickness than T23, and protruded portion does not remain on the peripheral portion of the light-shielding film 22. This makes it possible to reduce the difference in level attributed to the light-shielding film 22, and can reduce the color non-uniformity (image non-uniformity). Here, a similar advantageous effect is also produced in the case where the pad electrode 21 is formed instead of the light-shielding film 22.

FIG. 13E and FIG. 13F shows the case in which a>T23, that is, the distance from the outer end of the light-shielding film 22 to the outer end of the first removal area D is greater than the film thickness (T23) of the third insulating film 23. In this case, when the third insulating film 23 is partially removed, as shown in FIG. 13F, the protruded portion of the third insulating film 23 does not remain and the difference in level attributed to the light-shielding film 22 can be reduced. Furthermore, in the third insulating film 23, an area (the light-shielding film groove 25) having a smaller thickness than T23 is formed on a peripheral portion of the light-shielding film 22. With the light-shielding film groove 25 formed on a peripheral portion of the light-shielding film 22, an area in which the color filter is stored is created on the light-shielding film groove 25, and an area that includes the difference in level resulting from the light-shielding film 22 can be further reduced. This makes it possible to reliably reduce color non-uniformity (image non-uniformity). Here, a similar advantageous effect is also produced in the case where the pad electrode 21 is formed instead of the light-shielding film 22.

Furthermore, as shown in FIG. 12, the partition groove 27 in the pixel unit A and the light-shielding film groove 25 in the light-shielding unit B are formed not to overlap. In other words, the third insulating film 23 which is not removed and has a film thickness of T23 is surely formed between the partition groove 27 and the light-shielding film groove 25. This is because the partition is not formed when the partition groove 27 and the light-shielding film groove 25 overlap. Likewise, the partition groove 27 and the pad electrode groove 26 are formed not to overlap, Furthermore, in the case where a>T23, when the interval between the adjacent light-shielding films 22 or the interval b between the adjacent pad electrodes 21 is smaller than the two times 123, the adjacent grooves are formed to overlap. In other words, the third insulating film 23 having a film thickness of T23 does not exist between the adjacent light-shielding films 22 or adjacent pad electrodes 21. Likewise, in the case where the interval between the light-shielding film 22 and the pad electrode 21 is smaller than the two times T23 as well, the groove (the light-shielding film groove 25) of the light-shielding film 22 and the groove (the pad electrode groove 26) of the pad electrode 21 overlap, and the third insulating film 23 having a film thickness of T23 does not exist between the light-shielding film 22 and the pad electrode 21.

From the above study, the light-shielding film groove 25 is formed, for example, so that the distance a from the outer end of the light-shielding film 22 to the outer end of the first removal area D is greater than the film thickness of the third insulating film 23. Here, the outer end of the first removal area D refers to, out of the inner wall surfaces of the light-shielding film groove 25, the inner wall surface on a far side as viewed from the light-shielding film 22 in FIG. 1. Likewise, the pad electrode groove 26 is formed, for example, so that the distance a from the outer end of the pad electrode 21 to the outer end of the second removal area E is greater than the film thickness of the third insulating film 23. Here, the outer end of the second removal area E refers to, out of the inner wall surfaces of the pad electrode groove 26, the inner wall surface on a far side as viewed from the pad electrode 21 in FIG. 1. The partition groove 27 formed in the pixel unit A penetrates the third insulating film 23. Thus, when the above is stated differently, the light-shielding film groove 25 is formed so that the distance from the outer end of the light-shielding film groove 25 to the light-shielding film 22 is greater than the depth of the partition groove 27, and the pad electrode groove 26 is formed so that the distance from the outer end of the pad electrode groove 26 to the pad electrode 21 is greater than the depth of the partition groove 27, for example. Moreover, the third insulating film 23 needs to be formed between the light-shielding film groove 25 and the partition groove 27 to form the partition. Furthermore, the third insulating film 23 also needs to be formed between the pad electrode groove 26 and the partition groove 27. Thus, the distance a from the outer end of the light-shielding film groove 25 to the light-shielding film 22 is made smaller than the distance c between the light-shielding film 22 and the partition groove 27. Likewise, in the case where the pad electrode 21 and the partition groove 27 are adjacent to each other, the distance a from the outer end of the pad electrode groove 26 to the pad electrode 21 is made smaller than the distance (not shown in the drawing) between the pad electrode 21 and the partition groove 27.

Figure 14A:
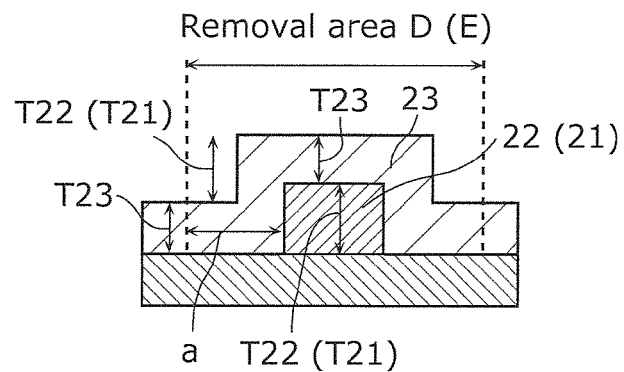
FIG. 14A is a diagram showing a result of study on depths of a light-shielding film groove and a pad electrode groove.
Figure 14B:
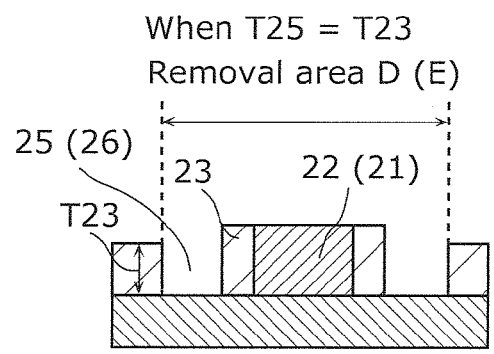
FIG. 14B is a diagram showing a result of study on the depths of the light-shielding film groove and the pad electrode groove.
Figure 14C:
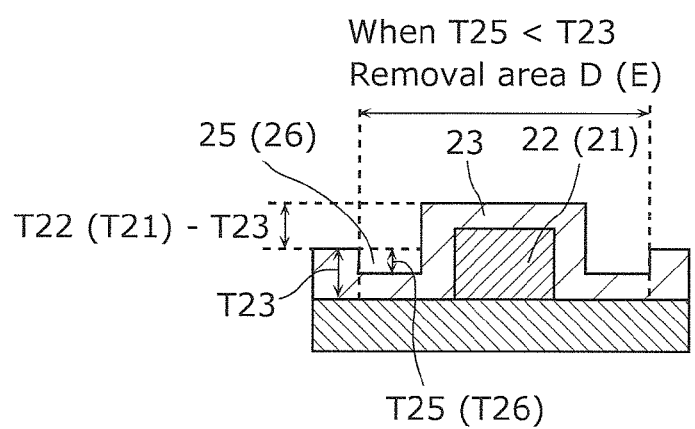
FIG. 14C is a diagram showing a result of study on the depths of the light-shielding film groove and the pad electrode groove.

Next, the result of the study on the depths of the light-shielding film groove 25 and the pad electrode groove 26 when a>T23 is shown in FIG. 14A to FIG. 14C. FIG. 14A is a cross-sectional view of the solid-state imaging device before the light-shielding film groove 25 or the pad electrode groove 26 is formed, and each of FIG. 14B and FIG. 14C is a cross-sectional view of the solid-state imaging device after the light-shielding film groove 25 or the pad electrode groove 26 is formed. Although the following describes the case of the light-shielding film groove 25 to simplify the description, the following applies to the case of the pad electrode groove 26 in a similar manner. Note that, in each of FIG. 14A to FIG. 14C. T22 represents the film thickness of the light-shielding film 22 (T21 represents the film thickness of the pad electrode 21), T23 represents the film thickness of the third insulating film 23, and T25 represents the depth of the light-shielding film groove 25 (T26 represents the depth of the pad electrode groove 26).

FIG. 14B shows the case of T25=T23 that is the case where the film thickness of the third insulating film 23 equals to the depth of the light-shielding film groove 25 to be formed. When the light-shielding film groove 25 is formed with this condition, the difference in level attributed to the light-shielding film 22 can be reduced by T23. Furthermore, a similar advantageous effect is also produced in the case of the light-shielding film groove 25 which penetrates the third insulating film 23 and is a groove formed on the surface of the second insulating film 60.

FIG. 14C shows the case of T25<T23 that is the case where the depth of the light-shielding film groove 25 to be formed is smaller than the film thickness of the third insulating film 23. When the light-shielding film groove 25 is formed with this condition, the difference in level attributed to the light-shielding film 22 can be reduced by 125. Moreover, when the light-shielding film groove 25 is formed with this condition, the thin third insulating film 23 remains on the light-shielding film 22. Thus, the upper portion of the light-shielding film 22, and the second embedded layer 19 and the first embedded layer 18 formed on a peripheral portion of the light-shielding film 22 are not exposed from the third insulating film 23, and are not exposed to the etching at the time of formation of the light-shielding film groove 25, for example. This makes it possible to reduce the problem such as increase in the resistance value or the decrease in reliability.

In this embodiment, the difference in level (T22 or T21) attributed to the light-shielding film 22 or the pad electrode 21 is approximately 760 nm, for example, and the depth of the light-shielding film groove 25 or the pad electrode groove 26 (125 or T26) formed by etching or the like is approximately 400 nm, for example. Therefore, the difference in level on the surface can be reduced from approximately 760 nm to approximately 360 nm, for example. In other words, the difference in level can be removed by approximately 400 nm, for example, Furthermore, the difference in level on the surface before the formation of the light-shielding film groove 25 or the pad electrode groove 26 is as great as the thickness of the light-shielding film 22 or the pad electrode 21 (T22 or T21). Thus, the light-shielding film groove 25 or the pad electrode groove 26 may be formed to have the depth equal to or smaller than T22 or T21.

In other words, the light-shielding film groove 25 or the pad electrode groove 26 is formed to have, for example, a depth greater than 0 and smaller than the film thickness of the third insulating film 23 formed on the light-shielding film 22 or on the pad electrode 21, to reduce the difference in level attributed to the light-shielding film 22 and the pad electrode 21 and not to reduce the reliability.

Furthermore, for example, the light-shielding film groove 25 or the pad electrode groove 26 has a depth smaller than the depth of the partition groove 27.

As described above, the method for manufacturing the solid-state imaging device according to this embodiment is a method for forming a solid-state imaging device including the pixel unit A, and the method includes: a process of forming a plurality of the photodiodes 40 in the pixel unit A in the semiconductor substrate 1; and a process of forming on the semiconductor substrate 1 the first insulating film 50 which covers the photodiodes 40. In addition, the method for manufacturing the solid-state imaging device further includes: a process of selectively forming, in a portion above each of the photodiodes 40, the recess 17 in the first insulating film 50; a process of forming the optical waveguide, which guides light to the photodiode 40, by forming the second insulating film 60 on the first insulating film 50 to embed the recess 17; and a process of forming conductive films such as the light-shielding film 22, the pad electrode 21, and the like on the second insulating film 60 in an area outside of the pixel unit A such as the light-shielding unit B, the peripheral circuit unit C, and the like. Furthermore, the method for manufacturing the solid-state imaging device further includes: a process of forming the third insulating film 23 on the second insulating film 60 and on the conductive films; a process of reducing the film thickness of the third insulating film 23 formed on the conductive films and the periphery of the conductive films in an area outside of the pixel unit A; and a process of forming, in the pixel unit A, the partition (the third interlayer insulating film 14 inside the partition groove 27) which penetrates the third insulating film 23. In particular, the method for forming the solid-state imaging device according to this embodiment is characterized by forming the third insulating film 23 after forming the light-shielding film 22 and the pad electrode 21, and forming, in the third insulating film 23, the light-shielding film groove 25 and the pad electrode groove 26.

Furthermore, in the method for manufacturing the solid-state imaging device according to this embodiment, the area outside of the pixel unit A includes the light-shielding unit B and the peripheral circuit unit C formed outside the light-shielding unit B, and in the process of forming the conductive film, a first conductive film and a second conductive film are each formed as the conductive film, the first conductive film (the light-shielding film 22) is formed in the light-shielding unit B, and the second conductive film (the pad electrode 21) is formed in the peripheral circuit unit C.

Furthermore, the method for manufacturing the solid-state imaging device according to this embodiment further includes a process of forming the lines, such as the first internal line 9, the second internal line 12, the third internal line 15, and the like in the first insulating film 50 in the peripheral circuit unit C, and the second conductive film is formed to be electrically connected to the lines.

With this, the difference in level attributed to the thicknesses of the light-shielding film 22 and the pad electrode 21 formed in the light-shielding unit B and the peripheral circuit unit C can be reduced, and it becomes possible to form the partition, the color filter, and the microlens with a small difference in level in the base. Thus, each of the materials can be uniformly formed in each pixel on a wafer. Thus, image non-uniformity, such as a blotch, does not occur, and a solid-state imaging device having superior property can be provided.

Variation

Next, a variation of the solid-state imaging device according to this embodiment is described.

Figure 15:
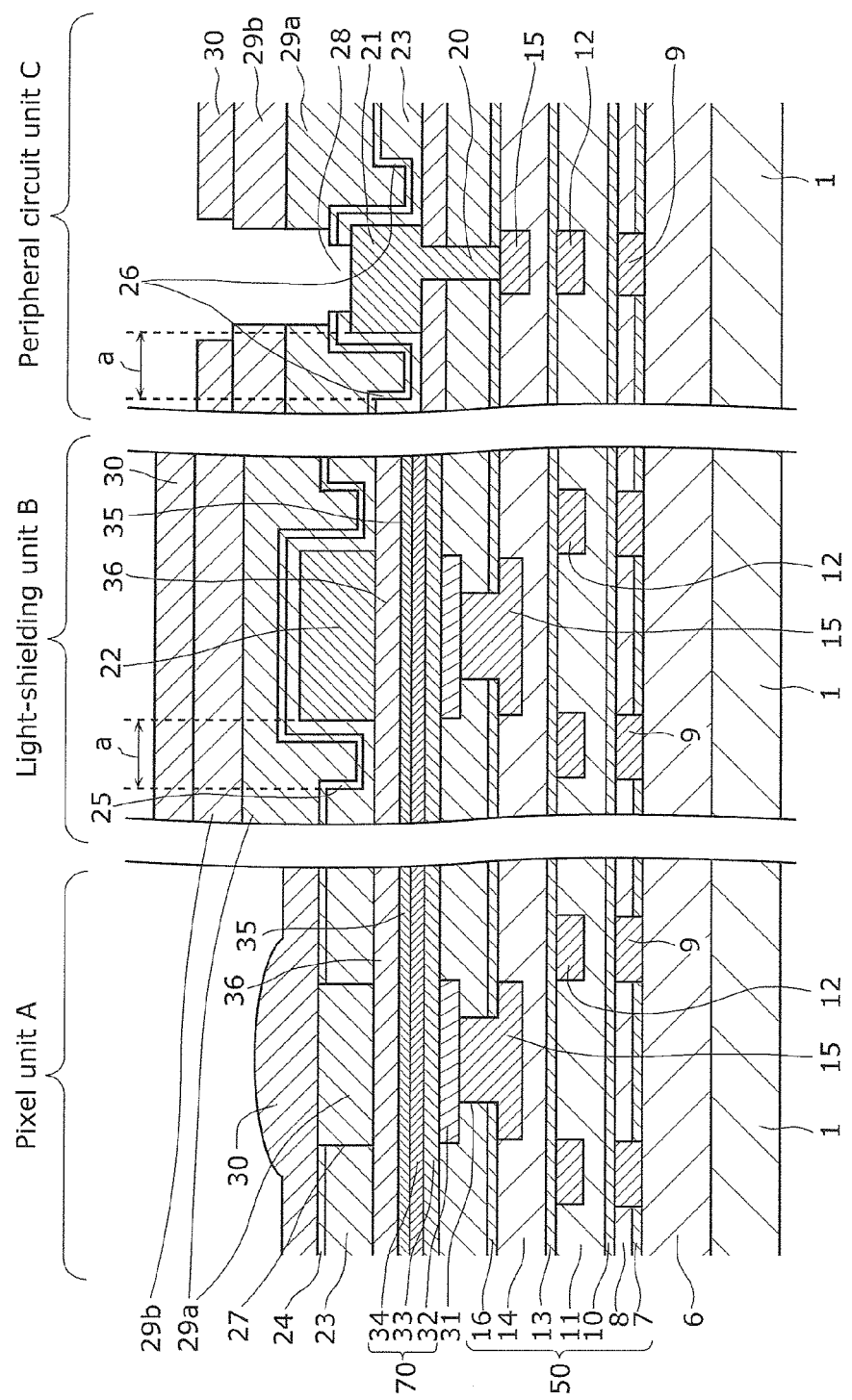
FIG. 15 is a schematic cross-sectional view of a main part of a solid-state imaging device according to a variation of the embodiment.
Figure 16:
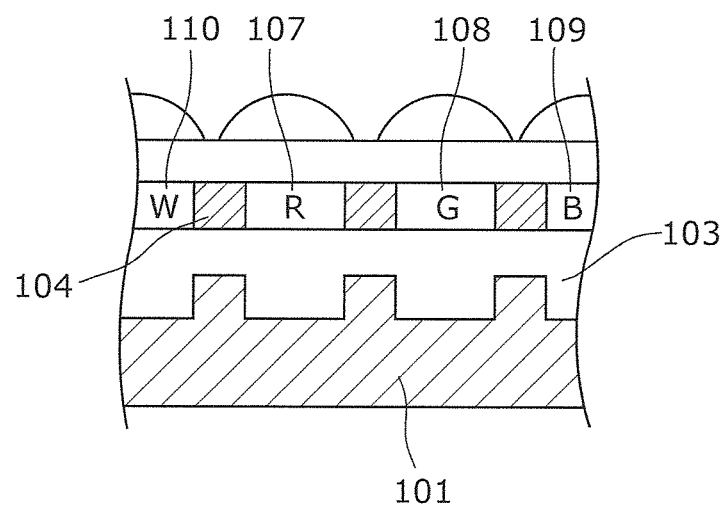
FIG. 16 is a schematic cross-sectional view of a solid-state imaging device according to patent literature 1.

FIG. 15 is a schematic cross-sectional view of a main part of a solid-state imaging device according to a variation of this embodiment.

The solid-state imaging device according to this variation is different from the solid-state imaging device according to this embodiment in that the solid-state imaging device according to this variation includes photoelectric conversion elements above the semiconductor substrate 1 instead of photodiodes in the semiconductor substrate 1. This solid-state imaging device is of a stacked type, and includes, in a similar manner as the photodiode type shown in FIG. 1, the pixel unit A, the light-shielding unit B, and the peripheral circuit unit C, which are separated sections on the semiconductor substrate 1, and includes internal lines such as the first internal line 9, the second internal line 12, and the third internal line 15, and the like. The following mainly describes parts different from the solid-state imaging device according to this embodiment.

The photodiode 40 is not formed in the pixel unit A and the light-shielding unit B. However, a photoelectric conversion element 70 which performs photoelectric conversion of incident light is formed above the internal lines. The photoelectric conversion element 70 includes (i) a lower electrode 32 that includes for example titanium nitride or the like, (ii) a photoelectric conversion film 33 that includes for example a stacked body including more than one layer of organic material, and (iii) an upper electrode 34 that includes for example an indium tin oxide or the like which are sequentially stacked. The photoelectric conversion element 70 is connected to the internal line via a contact hole 31 connected to the lower electrode 32. A first protective film 35 and a second protective film 36 are inserted, as a second insulating film, between the photoelectric conversion element 70 (the upper electrode 34) and the third insulating film 23.

The light-shielding film 22 and the pad electrode 21 are formed in the light-shielding unit B and the peripheral circuit unit C in a similar manner as the solid-state imaging device of a photodiode type. In other words, (i) the pixel unit A includes the photoelectric conversion element 70, (ii) the photoelectric conversion element 70 and the light-shielding film 22 are formed in the light-shielding unit B, and (iii) the pad electrode 21 is formed in the peripheral circuit unit C. Thus, a difference in level is generated in the light-shielding unit B and the peripheral circuit unit C due to the light-shielding film 22 or the pad electrode 21, and image non-uniformity such as a blotch is prone to occur when a color filter (the blue filter 29a and the red filter 29b) or the microlens 30 is formed on the portion having a difference in level. However, the difference in level attributed to the light-shielding film 22 and the pad electrode 21 can be reduced in a similar manner as the solid-state imaging device of a photodiode type because the light-shielding film groove 25 and the pad electrode groove 26 are formed in the light-shielding unit B and the peripheral circuit unit C. As a result, occurrence of the image non-uniformity, such as a blotch or the like, can also be reduced in the solid-state imaging device according to this variation, which makes it possible to provide a solid-state imaging device having superior properties.

Although the solid-state imaging device and the method for manufacturing the solid-state imaging device according to the present disclosure have been described based on the embodiment, the present disclosure is not limited to such an embodiment. Various modifications that may be conceived by those skilled in the art which do not depart from the essence of the present disclosure are intended to be included within the scope of the present disclosure. Furthermore, respective structural elements of the exemplary embodiment may be arbitrarily combined within the scope of the essence of the present disclosure.

For example, the third insulating film 23 in this embodiment which forms the partition groove 27, the light-shielding film groove 25, and the pad electrode groove 26 includes a silicon oxide, but needs not necessarily be limited to this. The third insulating film 23 may include a material having a refractive index lower than the refractive indices of the color filter and the second insulating film 60. The third insulating film 23 may include a material having a refractive index in the approximate range of 1.3 to 1.6, for example.

For simplification, this embodiment is described using the configuration in which the internal lines (the first internal line 9, the second internal line 12, and the third internal line 15) formed in the base (the first insulating film 50) are included in three layers in all of the pixel unit A, the light-shielding unit B, and the peripheral circuit unit C. However, the internal line in the base needs not necessarily be limited to such a configuration. For example, even when the pixel unit A includes internal lines in two layers, and the light-shielding unit B and the peripheral circuit unit C includes the internal lines in three layers, the situation is the same in that a difference in level resulting from the thickness of the light-shielding film 22 or the pad electrode 21 is at least generated in the pixel unit A and in the areas other than the pixel unit A, and a similar advantageous effect as this embodiment can be produced, In this embodiment, after the formation of the second insulating film 60, the light-shielding film 22 and the pad electrode 21 are formed to be in contact with the second insulating film 60. However, before forming the light-shielding film 22 and the pad electrode 21, a fourth insulating film including, for example, a silicon oxide may be formed to be in contact the second insulating film 60, and the light-shielding film 22 and the pad electrode 21 may be formed on the fourth insulating film. In this case, in the solid-state imaging device, a fourth insulating film is formed between the second insulating film 60 and the third insulating film 23, and the conductive films such as the light-shielding film 22, the pad electrode 21, and the like are formed on the fourth insulating film, and in the pixel unit A, the color filter is formed to penetrate the third insulating film 23 and the fourth insulating film. Here, it may be that the partition groove 27 is formed to penetrate the third insulating film 23 and the fourth insulating film in the pixel unit A, and the light-shielding film groove 25 and the pad electrode groove 26 penetrate the third insulating film 23 and do not penetrate the fourth insulating film in the light-shielding unit B and the peripheral circuit unit C. The fourth insulating film may include a material which has, for example, a lower refractive index than the second insulating film 60. Furthermore, the fourth insulating film may be, for example, a film including the same material as the third insulating film 23.

This embodiment described the configuration in which both the light-shielding film groove 25 and the pad electrode groove 26 are formed for the third insulating film 23. However, any one of the light-shielding film groove 25 and the pad electrode groove 26 may be formed. Note that, forming both the light-shielding film groove 25 and the pad electrode groove 26 makes it possible to further reduce the blotch (image non-uniformity) because the entire surface of the chip can be planarized compared to the case of forming only one of the grooves.

This embodiment described the light-shielding film 22 and the pad electrode 21 as examples of the conductive films formed in the second insulating film 60. However, as long as the conductive film is a conductive film formed on the second insulating film 60 and at least part of the upper surface of the conductive film is covered by the third insulating film 23, the conductive film need not be limited to the light-shielding film 22 and the pad electrode 21. With such a conductive film, a difference in level attributed to the conductive film is formed. Thus, applying the present disclosure to the conductive film produces an advantageous effect of reducing the blotch (image non-uniformity).

Although the microlens 30 is directly formed on the color filter in this embodiment, a highly transparent film may be formed as a planarizing film between the color filter and the microlens 30.

In this embodiment, the optical waveguide is formed as a structural element including a light-collecting function between the photodiode and the color filter. However, the structural element including the light-collecting function is not limited to this. Instead of the optical waveguide, an in-layer lens in an upwardly convex shape or downwardly convex shape may be formed according to the performance required by the solid-state imaging device. Alternatively, the structural element including the light-collecting function need not be formed.

INDUSTRIAL APPLICABILITY

One or more exemplary embodiments disclosed herein are widely applicable to a solid-state imaging device or the like which includes a partition that is provided between color filters, to reduce a difference in level attributed to a conductive film formed in an area outside of a pixel unit.

The invention claimed is:

1. A solid-state imaging device including a pixel unit configured to perform photoelectric conversion on incident light, the solid-state imaging device comprising:
   a semiconductor substrate;
   a second insulating film formed above the semiconductor substrate; and
   a third insulating film formed on the second insulating film, wherein in the pixel unit,
   a plurality of color filters are formed above the third insulating film,
   a partition is provided between adjacent ones of the color filters, the partition being a part of the third insulating film, and
   in an area outside of the pixel unit,
   a conductive film at least partially covered by the third insulating film is formed on the second insulating film, and
   the third insulating film is a film which reduces a difference in level resulting from the conductive film or the second insulating film.

2. The solid-state imaging device according to claim 1, further comprising
   a first insulating film between the semiconductor substrate and the second insulating film,
   wherein in the pixel unit,
   the semiconductor substrate is provided with a plurality of photodiodes,
   a portion of the first insulating film has a recess, the portion being located above each of the photodiodes,
   the second insulating film embeds the recess, and
   the second insulating film in the recess forms an optical waveguide which guides light to the photodiode.

3. The solid-state imaging device according to claim 1,
wherein the pixel unit includes a photoelectric conversion film between the semiconductor substrate and the second insulating film.

4. The solid-state imaging device according to claim 1,
wherein the third insulating film formed on the conductive film and on the second insulating film near the conductive film has a film thickness smaller than a film thickness of the partition.

5. The solid-state imaging device according to claim 1,
wherein in the area outside of the pixel unit,
the third insulating film near the conductive film is provided with a groove, and
out of inner wall surfaces of the groove, an inner wall surface on a far side as viewed from the conductive film is separated from the conductive film by a distance that is greater than or equal to a film thickness of the partition.

6. The solid-state imaging device according to claim 1,
wherein the third insulating film is made of a film having a refractive index lower than a refractive index of the second insulating film.

7. The solid-state imaging device according to claim 1,
wherein the area outside of the pixel unit includes a light-shielding unit, and
the conductive film is a light-shielding film formed in the light-shielding unit.

8. The solid-state imaging device according to claim 2,
wherein the area outside of the pixel unit includes a peripheral circuit unit,
the peripheral circuit unit includes:
a line formed in the first insulating film; and
a pad electrode which is formed on the line and is electrically connected to the line, and
the conductive film is the pad electrode.

9. The solid-state imaging device according to claim 2,
wherein the area outside of the pixel unit includes a light-shielding unit and a peripheral circuit unit formed outside the light-shielding unit,
the conductive film includes a first conductive film and a second conductive film,
the first conductive film is a light-shielding film formed in the light-shielding unit,
the peripheral circuit unit includes:
a line formed in the first insulating film; and
a pad electrode which is formed on the line and is electrically connected to the line, and
the second conductive film is the pad electrode.

10. The solid-state imaging device according to claim 1,
wherein in the area outside of the pixel unit, a portion of the third insulating film formed on the second insulating film near the conductive film has a film thickness smaller than a film thickness of the partition, the portion being formed around the conductive film.

11. The solid-state imaging device according to claim 1,
further comprising
a fourth insulating film between the second insulating film and the third insulating film,
wherein the conductive film is formed on the fourth insulating film, and
in the pixel unit, each of the color filters is formed to penetrate the third insulating film and the fourth insulating film.

12. The solid-state imaging device according to claim 1,
wherein the conductive film is a single layer film including aluminum.

13. The solid-state imaging device according to claim 1,
wherein the conductive film is a stacked film which includes at least a film including aluminum.

* * * * *